United States Patent
Hughes et al.

(10) Patent No.: US 9,940,260 B1
(45) Date of Patent: Apr. 10, 2018

(54) SYSTEM AND METHOD FOR CONTROLLING OPTIMIZED ACCESS TO MEMORY DEVICE HAVING THREE-DIMENSIONAL STACKED STRUCTURE

(71) Applicant: CADENCE DESIGN SYSTEMS, INC., San Jose, CA (US)

(72) Inventors: Anne Hughes, Austin, TX (US); Bikram Banerjee, Bengaluru (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/400,235

(22) Filed: Jan. 6, 2017

(51) Int. Cl.
*G06F 12/10* (2016.01)
*G06F 3/06* (2006.01)
*G11C 5/02* (2006.01)

(52) U.S. Cl.
CPC ............ *G06F 12/10* (2013.01); *G06F 3/0604* (2013.01); *G06F 3/0631* (2013.01); *G06F 3/0653* (2013.01); *G06F 3/0673* (2013.01); *G11C 5/02* (2013.01); *G06F 2212/65* (2013.01)

(58) Field of Classification Search
CPC ...... G06F 3/0604; G06F 3/0631; G06F 3/064; G06F 3/0653; G06F 3/0673; G06F 12/10; G06F 2212/65; G11C 5/02

USPC ...................... 711/5, 170, 202, 203, 209, 212
See application file for complete search history.

(56) References Cited

U.S. PATENT DOCUMENTS

| 9,666,300 B2 * | 5/2017 | Zhang ..................... G11C 17/16 |
| 2016/0162217 A1 * | 6/2016 | Song ..................... G06F 3/0638 711/118 |
| 2017/0212801 A1 * | 7/2017 | Tai ..................... G06F 11/1072 |

OTHER PUBLICATIONS

Hassan et al., "Near Data Processing: Impact and Optimization of 3D Memory System Architecture on the Uncore", MEMSYS '15, Oct. 2015, 11 pages.*

* cited by examiner

*Primary Examiner* — Gary Portka
(74) *Attorney, Agent, or Firm* — Rosenberg, Klein & Lee

(57) ABSTRACT

A memory controller system optimally controls access to a memory device having a plurality of integrated circuit (IC) chips disposed in a non-uniform stack configuration within a three-dimensional stacked (3DS) structure. A memory profiling portion executes to determine the non-uniform stack configuration. A virtual rank mapping portion configured to assign virtual ranks to chip locations actually defined by the non-uniform stack configuration. An address conversion portion executes to convert an unoptimized address definable with reference to a uniform stack configuration to an optimized address defined with reference to the non-uniform stack configuration. The addressing overhead during monitoring of data access operations to the memory device is optimized.

20 Claims, 11 Drawing Sheets

SYSTEM AND METHOD FOR CONTROLLING OPTIMIZED ACCESS TO MEMORY DEVICE HAVING THREE-DIMENSIONAL STACKED STRUCTURE

BACKGROUND OF THE INVENTION

The subject system and method are generally directed to a memory controller for controlling access to a memory device having a three-dimensional stacked (3DS) structure of integrated circuit (IC) chips. The system and method generally provide for assignment of virtual ranks to the chip locations in the memory device, and for conversion of an address defined with reference to a uniform stack configuration to an optimized address defined with reference to a non-uniform stack configuration of the memory device. This results in reduced addressing overhead, among other things.

Memory controllers are well known in the art. They are implemented as digital circuits dedicated to controlling/managing the flow of data written to and read from one or more memory devices. They may be suitably formed as separate devices or integrated with a central processing unit or other main controller, and serve the memory storage and access needs of various control or user application 'master' operations processed thereby. Memory controllers implement the logic necessary to read from and write to various types of memory devices, examples of which include dynamic random access memory (DRAM), as well as electrically programmable types of non-volatile memory such as flash memory, and the like.

Memory controllers actuate read and write data operations on the chips within a memory. Recent developments in memory design include the use of three-dimensional stacking (3DS), in which multiple memory chips or devices may be arranged in a "stack" that may be accessed through a point of interface previously configured for accessing a single chip. The resulting 3DS structures provide more data storage and are more flexible in how that storage is arranged.

However, to manage stacked memory, a memory controller must include additional circuitry, not only to select individual chips in a stack, but also to allow for longer memory addresses, and to track a larger number of data storage banks in the coupled memory or memories. That is, the circuitry of a given memory controller may, in practice, place an upper limit on the memory stack size that the memory controller is capable of managing; the size, complexity, and power consumption of a memory controller design may grow exponentially as this limit increases. Such an upper limit in turn places a ceiling on the storage size of 3DS memory.

There is therefore a need to optimize the management of 3DS memory so as to reduce the complexity of a memory controller relative to a maximum stack size of the corresponding memory.

SUMMARY OF THE INVENTION

It is an object of the disclosed system and method to generally reduce the complexity of a 3DS-configured memory controller.

It is another object of the disclosed system and method to optimize a 3DS-configured memory controller to account for non-uniform distribution of memory storage within a coupled 3DS memory device.

These and other objects may be attained in a system and method for controlling access to a memory device having a non-uniform, 3DS stacked structure.

While not limited thereto, an exemplary embodiment is directed to a memory controller system for controlling access to a memory device having a plurality of integrated circuit (IC) chips disposed in a non-uniform stack configuration within a three-dimensional stacked (3DS) structure. The system includes a memory profiling portion configured to determine the non-uniform stack configuration of the memory device. The non-uniform stack configuration is defined by a plurality of selectable stacks each having at least one selectable chip, with at least one of the stacks being formed by less chips than another of the stacks formed by a maximum number of chips, and occupies a subset of chip locations within a uniform stack configuration virtually defined by at least all stacks of the plurality of selectable stacks being formed by the maximum number of chips. The system further includes a virtual rank mapping portion configured to assign a subset of virtual ranks allocated for the uniform stack configuration virtually defined for the memory device to the subset of chip locations actually defined by the non-uniform stack configuration. The system further includes an address conversion portion coupled to said virtual rank mapping portion. The address conversion portion is configured to convert an unoptimized address definable with reference to the uniform stack configuration by an unoptimized set of bits to an optimized address defined with reference to the non-uniform stack configuration by an optimized set of bits shorter in bit length than said unoptimized set of bits. Addressing overhead during monitoring of data access operations to the memory device is optimized in the system.

While not limited thereto, another exemplary embodiment is directed to a memory controller system for controlling access to a memory device having a plurality of integrated circuit (IC) chips disposed in a non-uniform stack configuration within a three-dimensional stacked (3DS) structure. The system includes a memory profiling portion configured to determine the non-uniform stack configuration of the memory device. The non-uniform stack configuration is defined by a plurality of selectable stacks each having at least one selectable chip, with at least one of the stacks being formed by less chips than another of the stacks formed by a maximum number of chips, and occupies a subset of chip locations within a uniform stack configuration virtually defined by at least all stacks of the plurality of selectable stacks being formed by the maximum number of chips. The system further includes a virtual rank mapping portion configured to assign a subset of virtual ranks allocated for the uniform stack configuration virtually defined for the memory device to the subset of chip locations actually defined by the non-uniform stack configuration. The system further includes an address conversion portion coupled to said virtual rank mapping portion. The address conversion portion is configured to convert an unoptimized address definable with reference to the uniform stack configuration by an unoptimized set of bits to an optimized address defined with reference to the non-uniform stack configuration by an optimized set of bits shorter in bit length than said unoptimized set of bits. The virtual rank mapping portion executes to assign a virtual rank to each actual chip location according to the optimized address generated by the address conversion of an unoptimized address of the actual chip location. Addressing overhead during monitoring of data access operations to the memory device is optimized in the system.

While not limited thereto, yet another exemplary embodiment is directed to a method of optimally controlling access to a memory device having a plurality of integrated circuit (IC) chips disposed in a non-uniform stack configuration within a three-dimensional stacked (3DS) structure. The method includes executing a memory profiling portion of a memory controller system to determine the non-uniform stack configuration of the memory device. The non-uniform stack configuration is defined by a plurality of selectable stacks each having at least one selectable chip, with at least one of the stacks being formed by less chips than another of the stacks formed by a maximum number of chips, and occupies a subset of chip locations within a uniform stack configuration virtually defined by at least all stacks of the plurality of selectable stacks being formed by the maximum number of chips. The method further includes executing a virtual rank mapping portion of the memory controller system to assign a subset of virtual ranks allocated for the uniform stack configuration virtually defined for the memory device to the subset of chip locations actually defined by the non-uniform stack configuration. The method further includes executing an address conversion portion of the memory controller system to convert an unoptimized address definable with reference to the uniform stack configuration by an unoptimized set of bits to an optimized address defined with reference to the non-uniform stack configuration by an optimized set of bits shorter in bit length than said unoptimized set of bits. Addressing overhead during monitoring of data access operations to the memory device by the memory controller system is optimized.

Additional aspects, details, and advantages of the disclosed system and method will be set forth, in part, in the description and figures which follow.

DETAILED DESCRIPTION OF THE PREFERRED EMBODIMENTS

Figure 1:
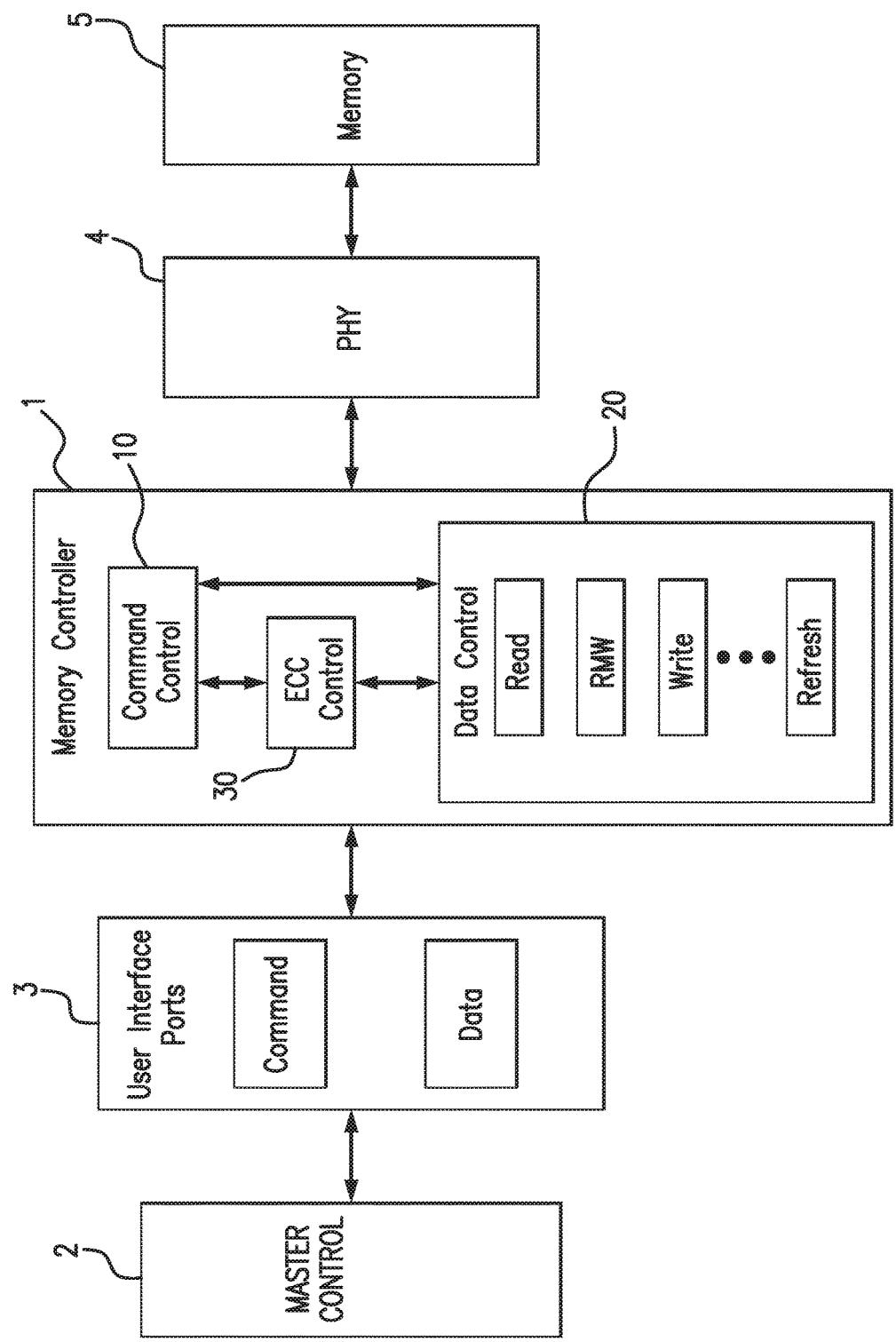
FIG. 1 is a schematic diagram generally illustrating a memory controller system operably intercoupled to provide control of a coupled memory, in one illustrative application.

Reference will now be made in detail to exemplary embodiments, which are illustrated in the accompanying drawings, wherein like reference numerals refer to the like elements throughout. The embodiments are described below in order to explain the disclosed system and method by referring to the figures.

Section headings are included in this Detailed Description. It is noted that these section headings are for convenience only and should not be interpreted as limiting the scope of the claimed invention in any way.

A memory device having a three-dimensional stacking (3DS) structure, or a plurality of such memory devices coupled to the same memory controller, frequently include stacks of differing numbers of integrated circuit (IC) chips. Conventional memory controllers do not adequately account for these unequal stack sizes, and instead monitor and maintain the memory device(s) as if all stacks were of uniform size, namely, no less than the size of the stack having the most chips (a maximum number of chips). This can grossly overestimate the actual number of chips to monitor and maintain. As a result, the memory controller becomes unnecessarily complex, often including measures to manage more than twice the number of chips that are actually present.

According to certain aspects of the invention, a memory controller is configured to virtually reorganize the chips of a coupled memory in an optimized fashion by assigning suitable rank values to each chip. The total number of available rank values available for assignment is reduced from the conventionally assumed number of chips, that conventional number being no smaller than the number of stacks multiplied by the maximum number of chips per stack. Memory controller complexity may be correspondingly reduced to track no more than a number of chips equal to the number of available rank values. The flexibility of rank value assignment allows this reduced complexity to cover the same memory device(s), by effectively distributing the available rank values among the non-uniform distribution of chips. As an additional advantage, the addresses for each chip may be based on the rank values, and the size in bits of the addresses, both as indexes and as portions of memory controller signals, may also be correspondingly reduced. Still other advantages are also introduced, many of which will be made clear to those of skill in the art from the description to follow.

1. Three-Dimensional Stacking Memories and Memory Controllers

Referring now to FIG. 1, there is shown a general schematic diagram illustrating a memory controller system 1 formed in accordance with one exemplary embodiment of the present invention operably intercoupled with other subsystems in an illustrative application. As generally shown, the memory controller system 1 serves to provide control of a memory 5 (formed by one or more memory devices or chips of any suitable type and configuration known in the art) to support processing of a master control operation by a master controller 2. The memory controller system 1 communicates with the master controller 2 through one or more user interface ports 3, and with the memory 5 through a physical interface (PHY) 4 configured with a suitable interface standard known in the art for the memory 5.

The overall system schematically illustrated in FIG. 1 may be implemented in any known form, depending on the particular requirements of the intended application. For example, the overall system may be realized by discretely interconnected subsystems, or in sufficiently integrated in the form of a system-on-chip (SOC) or the like, depending again on the particular requirements of the intended application. As the master controller 2, user interface port(s) 3, and PHY 4 may be of any suitable type and configuration known in the art, subject to the particular requirements of a given application, no further description thereof is needed for description of features relating to the memory controller system 1 or memory 5. Those skilled in the art will recognize that the overall system shown will typically include numerous other subsystems, logic components, driver circuit portions, and the like other than those generally illustrated in FIG. 1 to carry out its particularly intended functions. In the interests of brevity and clarity, those particular functions outside the system and method disclosed herein are not shown, but will be apparent to those skilled in the art in the context of the particular application intended.

Memory controller system 1 generally includes a command control portion 10 coupled to a data control portion 20 and, optionally but preferably, an error control portion 30. In the embodiment shown, the data control portion 20 preferably includes one or more digital circuits which implement the functional logic to carry out a plurality of data access operations on memory 5. These data access operations include read, write, and read-modify-write operations conducted on selectively addressed storage locations defined in the memory 5. The data access operations preferably include control of such additional functions as periodic data refresh (as required by the particular type of memory device(s) 5 employed) and/or others known in the art.

The error control portion 30 is operably coupled to the data control portion 20, and preferably includes one or more digital circuits which implement the functional logic for detecting and correcting error in data segments as stored in memory 5. The error control portion 30 preferably includes execution of ECC processing of predetermined code format, such as SECDED, to detect error in a corrupted data segment read from the memory 5. The error control portion 30 is configured to correct the data segment read from the memory having error that is correctable with the given ECC, and report (for the master control operation) those data segment errors which are detected but are not correctable with the given ECC.

The command control portion 10 is operably coupled to both the data control and error control portions 20, 30. The command control portion 10 is preferably formed by one or more digital circuits which implement the functional logic for generating commands to actuate various data access operations of the data control portion 20. The command control portion 10 includes a corrective writeback unit which executes responsive to detection of a correctable error in a data segment to actuate a read-modify-write operation by the data control portion 20 on the storage locations corresponding to the corrupt data segment. The corresponding storage locations of the memory 5 are adaptively scrubbed as a result.

Figure 1A:
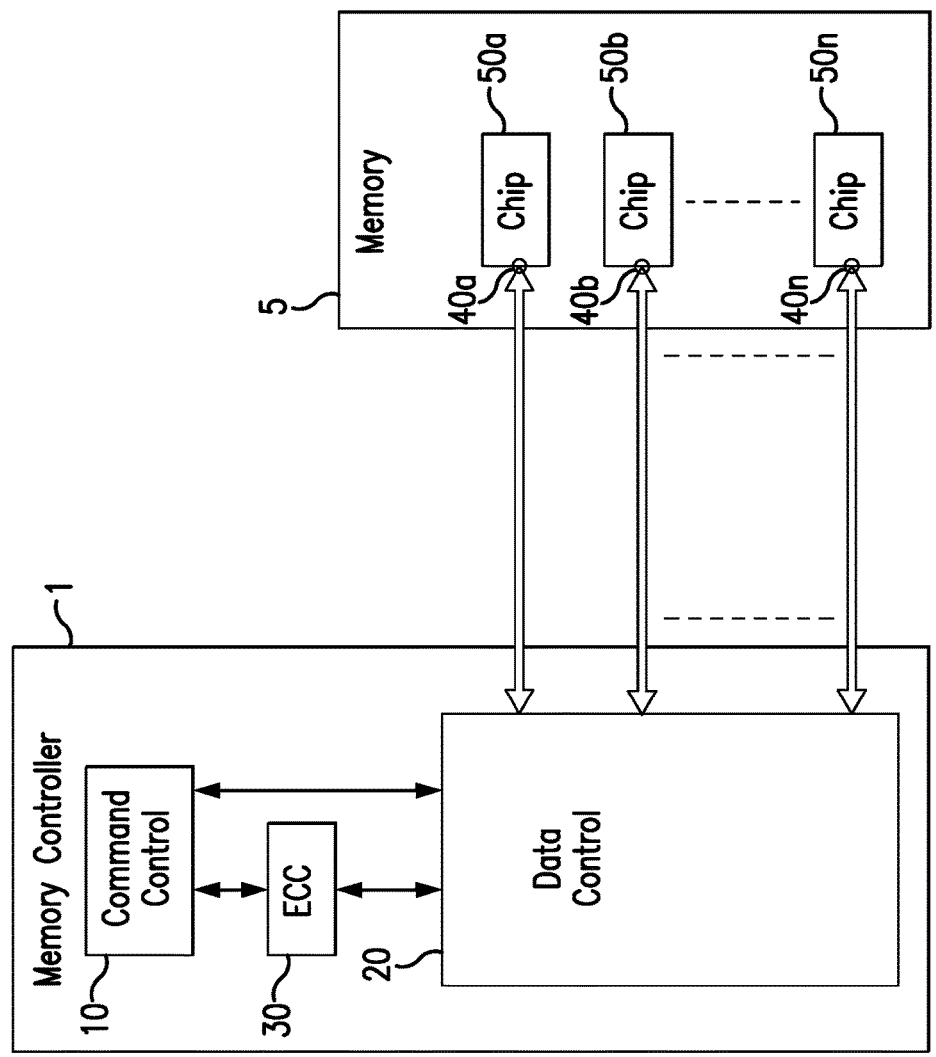
FIG. 1A is a schematic detailing certain portions of the system shown in FIG. 1 when coupled to a planar-style memory.

Referring to FIG. 1A, certain elements of the memory controller 1 and its cooperation with the memory 5 are described in more detail, in connection with a "planar-style" memory arrangement. In a planar arrangement, memory modules such as memory 5 contain a set of memory devices or "chips" 50a through 50n, any of which may store data. A chip 50a within memory 5 may be selected through the data control 20, for either writing or reading data, using a chip select (CS) reference; that is, a "CS address." A reference to a "bank" within a chip is also part of a complete memory address; a bank includes a portion of a chip that is activated in order to write to or read from that portion. The address may further include references to rows, columns, and other addressing features within the bank; various suitable measures for arranging these addressing features are known in the art and will not be detailed here. Because the specifics of address formatting below the bank level may vary between systems and are not relevant to the invention, for brevity, any portion of the address referencing a level lower than the bank will not be discussed further, as any suitable approach may be employed for complete memory addressing. Also for brevity, hereinafter, any portion of the address referencing a level at or lower than the bank will be grouped together as a "bank address" or "bank portion" of the address.

In a planar arrangement, each chip 50a through 50n in the memory 5 is connected to the memory controller 1 through a corresponding coupling point of a plurality of coupling points 40a through 40n; that is, a port or other mechanism which couples the chip to the system. It is noted that the term "coupling point" is used for convenience, and generally refers to a point of interface for communication of any signals specifically between the memory controller and the coupled chip, which may include not only data content but addresses within the chip, commands, and other signals.

In FIG. 1A and other figures, paths of communication leading from the data control portion 20 to the coupling points 40a through 40n are depicted as separate from each other for convenience. However, it is noted that, depending on the configuration of the PHY 4, memory 5, and other features of the system, these communication paths may be merged as a single bus or similar, or otherwise not distinct from each other, until contact with the coupling points. The embodiments described below operate in essentially the same manner regardless of the pathing arrangements between the data control portion 20 and the coupling points 40a through 40n, and therefore these pathing arrangements will not be addressed further.

Each CS address references one of these coupling points 40a through 40n. The data control 20 selects the appropriate coupling point according to the CS portion of a memory address, and accesses the chip coupled to the coupling point. The other portions of the memory address may then be used by the accessed chip to select a specific memory location within the chip. Each of the chips 50a through 50n may be conveniently accessed by the memory controller through their separate coupling points 40a through 40n, without interference with signals to other chips at this point of transmission.

Depending on the system organization, multiple independent memory devices may be separately coupled to the coupling points 40a through 40n, or a single memory module with multiple integrated chips may be coupled generally to the rest of the system, with each coupling point for each chip integrated with or disposed within the module. The latter example is illustrated in FIG. 1A. In some configurations, a coupling point such as 40a may be integrated with the associated chip 50a itself. Furthermore, the memory controller itself may also be integrated with the memory module. However, the embodiments described below operate in essentially the same manner in various suitable memory arrangements, although certain features and operations may be absent in cases where the applicable configuration is not available. For this reason, references to "the memory device" coupled to the memory controller 1 can refer to any of the various suitable memory arrangements, including multiple independent memory devices, unless specifically noted otherwise.

In a planar arrangement, as illustrated in FIG. 1A, a single chip or equivalent, such as chip 50a, is linked to each coupling point, such as coupling point 40a. Therefore, the number of coupling points 40a through 40n defines an upper limit on the number of chips 50a through 50n that may be coupled to the memory controller 1 and the system as a whole.

Figure 1B:
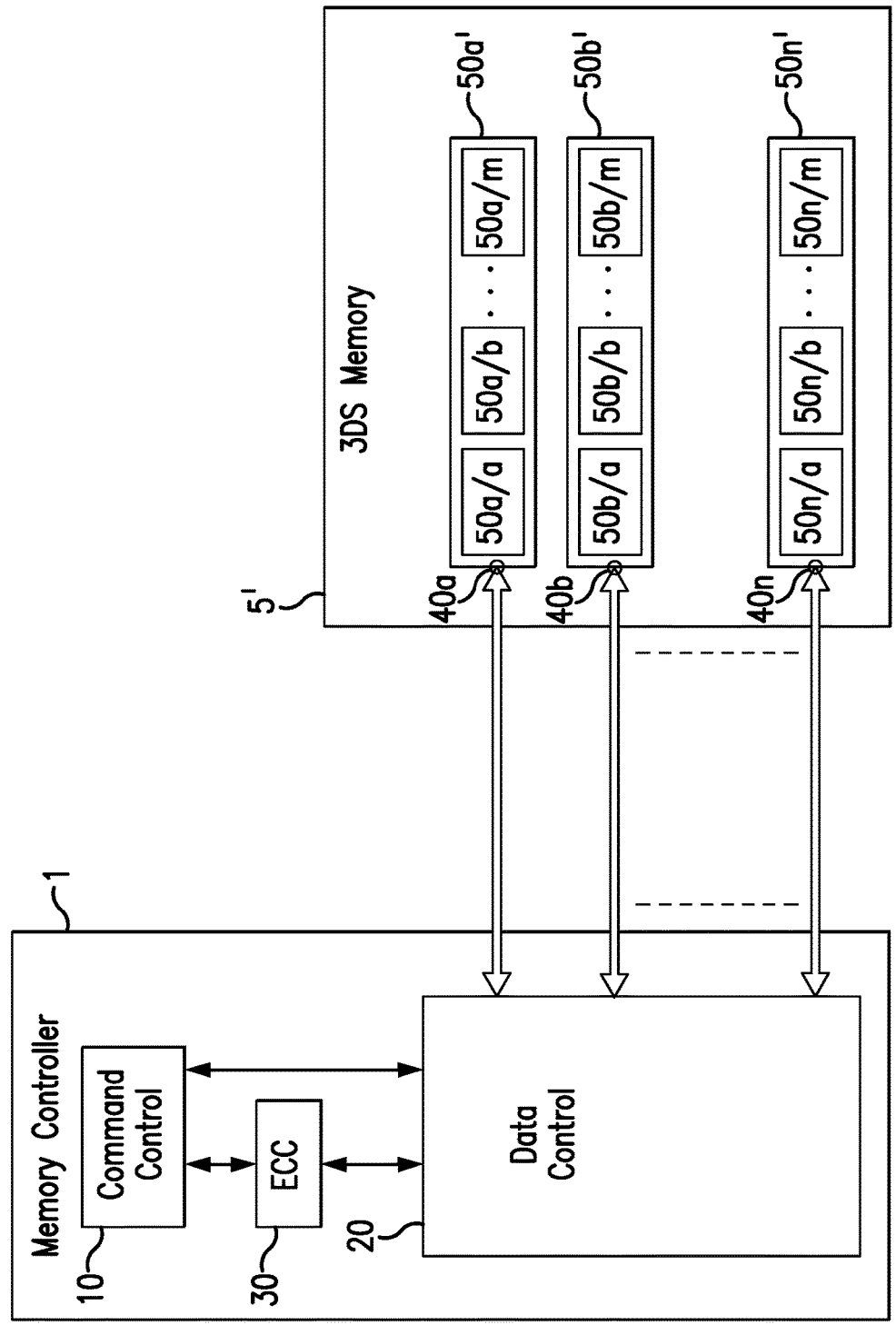
FIG. 1B is a schematic detailing certain portions of the system shown in FIG. 1 when coupled to a 3DS-style memory.

However, three-dimensional stacking (3DS) memory modules and devices are configured with "stacked" chips. Referring to FIG. 1B, an example of such a 3DS memory 5' is illustrated. Under a common 3DS structure such as illustrated by the 3DS memory 5', in place of a single chip 50a, a plurality of chips 50a/a through 50a/m are organized into a stack 50a'. The stack 50a' is then coupled as a whole to the system through the corresponding coupling point 40a.

Therefore, a unique CS address such as the address for coupling point 40a preferably serves as the address for an entire stack of chips 50a'. A chip identity (CID) or chip level address then references an individual chip, such as chip 50a/b, within a CS-selectable stack. In most but not all addressing approaches, the CID address is a universal reference across the stacks; that is, the same format of address is used for all stacks, where a chip located at a "first chip level" of a stack uses the same CID address for all stacks, and likewise for the "second," "third," and other chip levels. The assignment of each "chip level" in a stack is preferably according to their physical positions relative to the coupling point, as this positioning may be expected to have certain effects on the precise timing and other behaviors of a signal to a chip at the given level. In this approach, the "first chip level" refers to the chip closest to the coupling point.

It is noted that, although 3DS structures allow a stack of multiple chips, rather than just one chip, to be coupled to a single coupling point, the pre-3DS terms "chip select" and "CS" have remained common terms in the art for the coupling point, the coupled stack, and the addressing of each, out of tradition and convenience. This description will also continue to use this terminology.

In the above manner, the combination of CS address and CID address defines the address of a single chip's location within the 3DS structure, and the combination of CS address, CID address, and bank address preferably defines a complete address for a memory bank in the 3DS memory 5'.

Stacks may be described by the number of chips within (e.g. an "8-high stack" or "8-high CS"). For instance, the example stacks illustrated in the memory 5' of FIG. 1B are all "m-high stacks" containing "m" chips. A "stack" with only one chip may be termed "planar" or "unstacked," but 3DS systems may treat an unstacked chip like others stacks, albeit a stack of height 1. (It is noted, however, that a planar chip does not require certain routing circuitry, which is required for a stack to route signals between levels of the stack, and which may be expected to introduce a small additional timing delay even to a first level chip in a stack which is not present for a planar chip. Larger stacks may employ more complex routing circuitry and, correspondingly, experience longer delay.)

Stacking methodologies are known in the art and, for brevity, will not be described here in detail. 3DS operations are preferably, but not necessarily, built upon the DDR3, DDR4, or other such specification, which are also known in the art.

Despite the advantages of a 3DS configuration, stacking also introduces additional overhead. For example, at least the CID portion of an address must be maintained for the period after a stack is accessed but before an individual chip is accessed. Additionally, as noted above, the larger the stack, the greater the timing delay to access any location within. Switching between CID levels in a stack will also introduce delay and overhead similar to that experienced when switching between stacks.

The above issues may be ameliorated or avoided for data stored in smaller stacks, but larger stacks are also desirable for greater storage, among other advantages. Therefore, although the 3DS memory 5' in FIG. 1B was illustrated for convenience as having a uniform stack configuration with stacks of equal size or "height," in practice a 3DS memory may be expected to have a heterogeneous or non-uniform stack configuration. That is, a module designer or consumer might arrange some stacks at the maximum size possible, with intent to store the majority of infrequently-accessed data within, but arrange another stack to be smaller, or even planar (that is, only one, unstacked chip), to store smaller amounts of data which will need more frequent access. In this manner, the various overhead and delays described above are avoided for the most frequently accessed data. It is also possible that not all coupling points will be required, and some may have no chips coupled as a result. Furthermore, in systems where an end consumer may arrange individual memory devices, one to each coupling point and corresponding CS address, completely different memory devices may be coupled to each coupling point due to irregular or partial hardware upgrades.

2. Existing Limitations on 3DS Memory Control

Referring again to FIGS. 1 through 1B, the memory controller 1, and more specifically the data control portion 20, executes read and write commands in order to access data on a memory module. A memory controller 1 also preferably stores, in one or more tracking tables which may be incorporated into the command control 10 or elsewhere, state information of each memory chip and bank (and, in some memory controllers, smaller memory locations) in the 3DS memory 5'. The state information for each bank may include the open state, timing, and error correction data, among other data which will be recognized in the art, all of which contributes to improved control of the data in the bank and the memory 5' itself. The total number of banks ($B_{SUPP}$) it can track, or support, in this manner is defined by the configuration and complexity of the memory controller 1.

Additionally, as previously established, the memory controller 1 is coupled to each stack or planar chip through coupling points 40a through 40n, and therefore the number of coupling points corresponds to the maximum number of stacks the memory controller 1 can be coupled to. As the number of the coupling points is generally known when the memory controller 1 is constructed, the memory controller 1 may be configured to manage up to the maximum number of stacks ($CS_{MAX}$); alternatively, the memory controller may be configured for $CS_{MAX}$ first and the appropriate number of coupling points provided. It is also noted that, in memory modules with integrated coupling points, such as depicted in FIGS. 1A and 1B, the number of stacks and/or planar chips are decided first and the appropriate number of coupling points are then included.

The memory controller 1 also defines a maximum number of banks per chip it can manage ($B_{MAX}$, for addressing, monitoring, and other reasons. If configured to manage a 3DS memory 5', the memory controller 1 also defines a maximum number of chip levels (that is, a maximum "stack height," or $CID_{MAX}$) it can process through each stack or coupling point, again for addressing and other reasons.

In a "brute force" approach, a 3DS-enabled memory controller 1 is configured so it can manage a 3DS memory 5' where each coupling point 40a through 40n is coupled to a stack which has the maximum stack height. That is, the memory controller 1 assumes a 3DS memory 5' of uniform stack configuration, each stack containing the maximum number of chips. Therefore, the memory controller 1 must be configured to support a number of banks equal to the maximum number of stacks, multiplied by the maximum stack height, multiplied by the maximum number of banks per chip; that is, $B_{SUPP} = CS_{MAX} \times CID_{MAX} \times B_{MAX}$.

However, the actual number of chips, and by extension the number of banks, in a 3DS memory 5' may be considerably lower than the assumed number, due to a non-uniform stack configuration. Therefore, the memory controller 1 and its portions include extra gates, larger multiplexors, and other circuit complexities that are necessary for a uniform stack configuration but unnecessary for the coupled 3DS memory 5'.

This excess complexity is frequently a factor in what value is established for $CID_{MAX}$ and/or $B_{MAX}$ during the memory controller's design process. Higher values for either $CID_{MAX}$ or $B_{MAX}$ will correspondingly increase $B_{SUPP}$, and by extension the memory controller's complexity, such that the controller's speed, size, power consumption, manufacturing cost, or other qualities might not meet desired design specifications. Higher values for $CID_{MAX}$ or $B_{MAX}$ will also increase the size of the portion of a memory address necessary to define the CID address or bank address, and by extension the complete memory address; this in turn requires larger storage for these addresses in, for instance, a tracking table.

However, lower values for $CID_{MAX}$ or $B_{MAX}$ place limits on the memory controller 1 in the coupled memories it can manage and control.

3. Rank Identifier Approach

Therefore, an optimized memory control system, instead of defining a maximum stack height ($CID_{MAX}$), defines a "maximum rank" value ($R_{MAX}$). ($CS_{MAX}$ remains, in at least some configurations, an additional value physically defined by the number of coupling points.) Each physical chip in a memory has an assigned rank identifier, and when managing chips (or banks), the memory controller tracks the chip (or the chip containing the bank) by its rank rather than its combination of CS and CID. The memory controller then merely needs to be able to support a number of banks equal to the maximum rank value multiplied by the maximum number of banks per chip, or $B_{SUPP} = R_{MAX} \times B_{MAX}$.

The term "rank identifier" of a chip, or "rank" without qualification, refers herein to the rank value uniquely assigned to the chip. When referring to a chip by its corresponding combination of CS and CID addresses, reference is made to "CS/CID" in this description for convenience, although it is understood that any suitable form of reference may be employed in practice.

The resulting memory controller provides enhanced flexibility of use. As a simple example, a memory controller with an $R_{MAX}$ value of 8 and four physical coupling points (i.e. a $CS_{MAX}$ value of 4) can manage any of the following 3DS memory arrangements (where R is the total number of ranks in the memory device, and CS is the total number of stacks in the memory device), among others:

1. A single 8-high stack, with the remaining three coupling points uncoupled (R=8, CS=1).
2. Two 4-high stacks, with the remaining two coupling points uncoupled (R=8, CS=2).
3. Four 2-high stacks (R=8, CS=4).
4. Two 2-high stacks and two planar chips (R=6, CS=4).
5. One 4-high stack and three planar chips (R=7, CS=4).

To manage the same variety of memory arrangements, a more traditional memory controller would need to be configured for a $CS_{MAX}$ value of 4 and a $CID_{MAX}$ value of 8, which for the same value of $B_{MAX}$ quadruples the value of $B_{SUPP}$, and by extension dramatically increases the complexity of the memory controller. Such a memory controller is also capable of managing, for instance, a 3DS memory with four 8-high stacks, but for the reasons provided above will almost never encounter such a memory in practice. Rather, the fourth and fifth arrangements listed above are far more likely. A rank-configured memory controller is therefore optimized in complexity for 3DS memory arrangements that appear in practice.

It is also noted that the new value of $B_{SUPP}$ is more reflective of the actual maximum memory capacity of a coupled memory device. That is, both the memory capacity of a 3DS memory and the minimum $B_{SUPP}$ of a memory controller capable of supporting said memory will more directly correspond to each other.

4. Mapping Rank Identifiers

Figure 2:
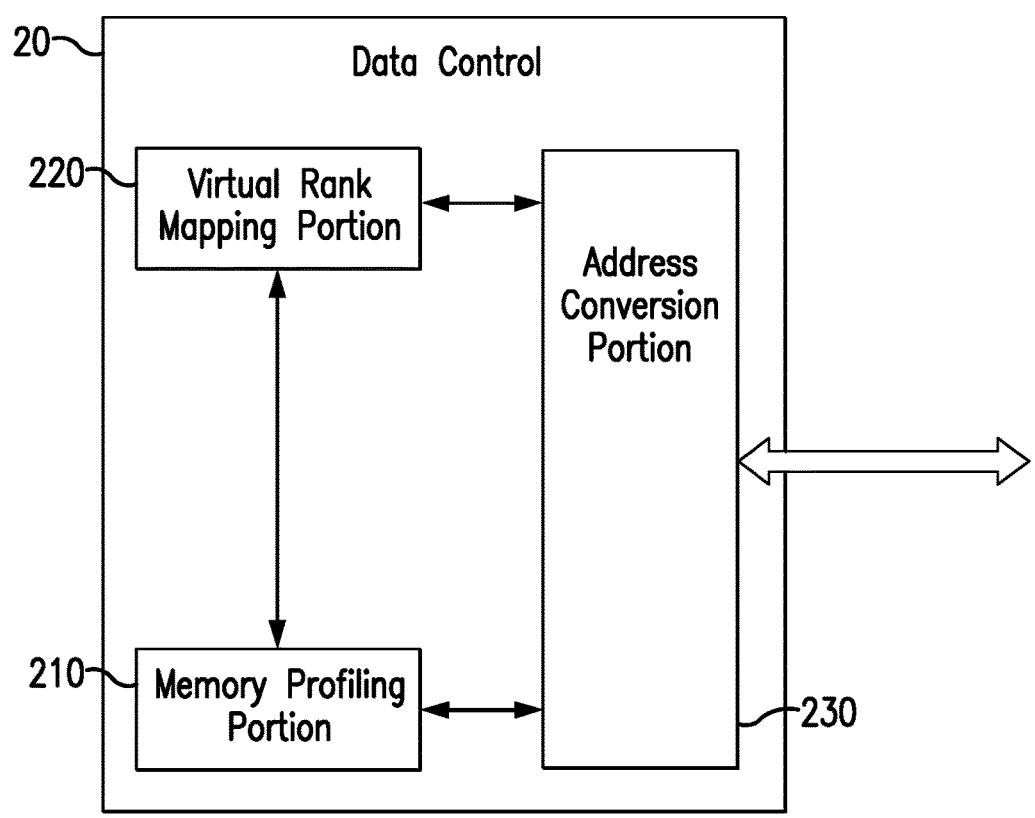
FIG. 2 is a schematic diagram showing one exemplary embodiment of a data control portion of the system embodiment shown in FIG. 1, illustrating certain operable coupling thereof with other portions of the system in an embodiment of the present invention.

Referring to FIG. 2, a schematic diagram illustrates the intercoupling of certain functional units of the data control portion 20 of the memory controller system 1, as formed in accordance with one exemplary embodiment of the present invention. In the interests of brevity and clarity, only certain parts (units/modules/sections) of the overall data control portion 20 pertaining to its rank mapping and conversion functions are illustrated. Those other parts of the data control portion 20, as well as the command control and error control portions 10, 30 of the memory controller system 1, which are not shown or specifically described may be of any suitable type known in the art configured to suit the particularly intended application. The particular details of such other parts and portions will be apparent to those skilled in the art.

Preferably, the memory controller 1 includes a memory profiling portion 210. In the illustrated embodiment, the memory profiling portion 210 is integrated into the data control 20, but it may also be integrated into the command control 10 or other elements of the memory controller 1.

When a 3DS memory 5' is generally coupled to the system, the memory profiling portion 210 actuates to determine the configuration of the memory 5'. That is, the memory profiling portion 210 determines the height of each stack in the memory 5'. Various techniques for doing so are known in the art and will not be detailed herein, but can include incrementally sending "pings" or other simple signals to each possible CID address in each stack until no response is received, thus determining the "highest" valid CID address for each stack. If the configuration of the memory 5' is known in advance, it may also be manually programmed (preferably, with other memory characteristics) into the memory profiling portion 210 or other portion of the memory controller 1.

Preferably, if the memory 5' has a non-uniform stack configuration (that is, stacks of unequal numbers of chips), the memory profiling portion 210 virtually defines an equivalent uniform stack configuration, which may be pictured as a grid. A simple example of such a grid is illustrated in FIG. 3.

The stack with the most chips in the memory 5'—in this example, stack 50a, with eight chips—defines the "height" of the uniform stack configuration, and the number of stacks—in this example, the four stacks 50a through 50d—define the "width." (In certain embodiments, the uniform stack configuration may instead be defined in width by the number of coupling points, regardless of whether a stack is coupled thereto.) The uniform stack configuration therefore defines a number of chip locations equal to the "height" multiplied by the "width." The "columns" of the uniform stack configuration may be treated as equivalent to CS addresses, and the "rows" may be treated as equivalent to CID addresses.

Figures 3, 3A:
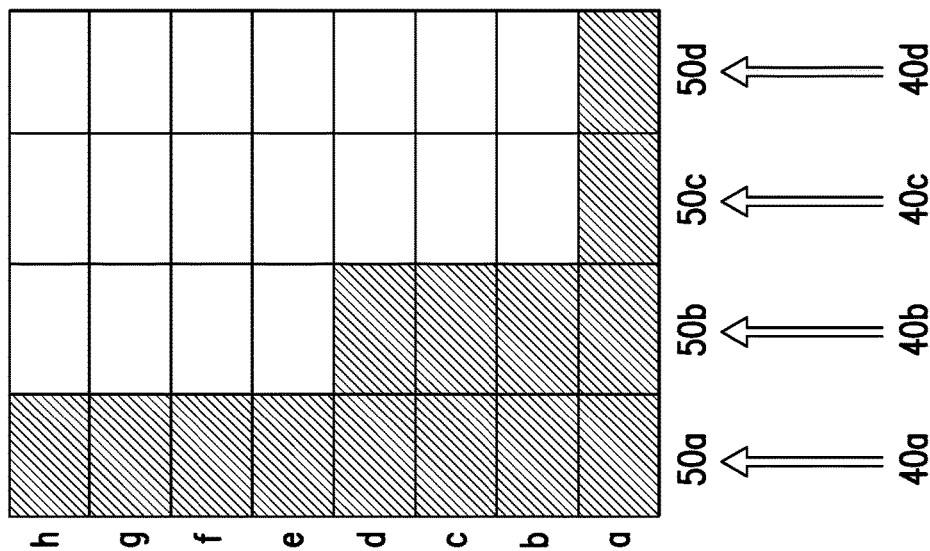
FIG. 3 is a diagram illustrating an example non-uniform stack configuration of a 3DS memory defined in relation to a virtual uniform stack configuration, in accordance with an embodiment of the present invention.
FIG. 3A is a diagram illustrating an assignment of rank values to the example non-uniform stack configuration illustrated in FIG. 3, in accordance with an embodiment of the present invention.

The actual, non-uniform stack configuration of the memory 5' may then be defined relative to the equivalent uniform stack configuration, as depicted in the example of FIG. 3. Because the stacks are of unequal size, at least one stack, such as stack 50b, will be "shorter" than the stack with the most chips, and will not fill its "column" in the virtual uniform stack configuration. As a result, the chips in the actual, non-uniform stack configuration occupy some, but not all, chip locations of the virtual, uniform stack configuration.

Storage of the actual and uniform configurations relative to each other may be accomplished using multiple encodings known in the art, a simple example being a bit grid or bit array. For instance, a bit array representing the example of FIG. 3 would read

```
        0 0 0 0 0 0 0 0
        0 0 0 0 1 1 1 1
        0 1 1 1 1 1 1 1
        0 1 1 1 1 1 1 1
``` where the leftmost column represents the base CID level across all CS addresses, the top row represents the first CS address, and a 0 bit represents that the chip location is occupied by a chip in the actual stack configuration while a 1 bit represents that the chip location is not occupied by a chip.

In the example of FIG. 3, the memory 5' includes a stack 50a of eight chips and a stack 50b of four chips, while "stacks" 50c and 50d are planar chips, for a total of fourteen chips. Under the traditional "brute force" approach, the memory controller 1 would nonetheless be configured to assume that every chip location in the equivalent uniform stack configuration was occupied by a chip; that is, configured to track, maintain, and control thirty-two chips, more than twice as many chips as are actually present.

Therefore, returning to FIG. 2, the memory controller 1 includes a virtual rank mapping portion 220. In the illustrated embodiment, the virtual rank mapping portion 220 is integrated into the data control 20, but it may also be integrated into the command control 10 or other elements of the memory controller 1.

Once the stack configuration of the memory 5' is determined, preferably by the memory profiling portion 210, the virtual rank mapping portion 220 actuates to assign virtual ranks to the locations of the chips in the memory 5'.

A total number of available virtual ranks is preferably equal to the defined $R_{MAX}$, although not all virtual ranks may be assigned for a given memory. For example, to manage the example stack configuration depicted in FIG. 3, $R_{MAX}$ may be as low as fourteen, but may also be a higher value such as sixteen or twenty-four. (For a binary implementation, the value of $R_{MAX}$ is preferably a power of two, and therefore in this example is preferably sixteen.)

If $R_{MAX}$ exceeds the number of chip locations in the virtual, uniform stack configuration, the number of available but unassigned virtual ranks will exceed the number of unoccupied chip locations in the virtual, uniform stack configuration, and most advantages of the system will be lost. This circumstance can nonetheless arise when the memory controller 1 is coupled to a memory 5' that is of much smaller size than expected.

In one embodiment, the virtual rank mapping portion 220 assigns the rank values for each chip arbitrarily.

In another embodiment, the virtual rank mapping portion 220 assigns the rank values in a simple ordered fashion. For instance, for the example stack configuration of FIG. 3, the ranks are assigned as depicted in FIG. 3A. Ranks 0 through 7 are assigned to the chips of stack 50a, bottom to top; ranks 8 through 11 to the chips of stack 50b, bottom to top; rank 12 to the single chip of planar "stack" 50c; and rank 13 to the single chip of planar "stack" 50d. The remaining chip locations are not occupied by actual chips and are not assigned a rank value.

In other embodiments, the virtual rank mapping portion 220 assigns the rank values according to an optimization process which mathematically converts a chip location to a corresponding rank. Three examples of such optimization processes are now described. (It is assumed, for any of these processes, that it has already been determined that a total number of chips in the memory does not exceed $R_{MAX}$.)

Figure 3B:
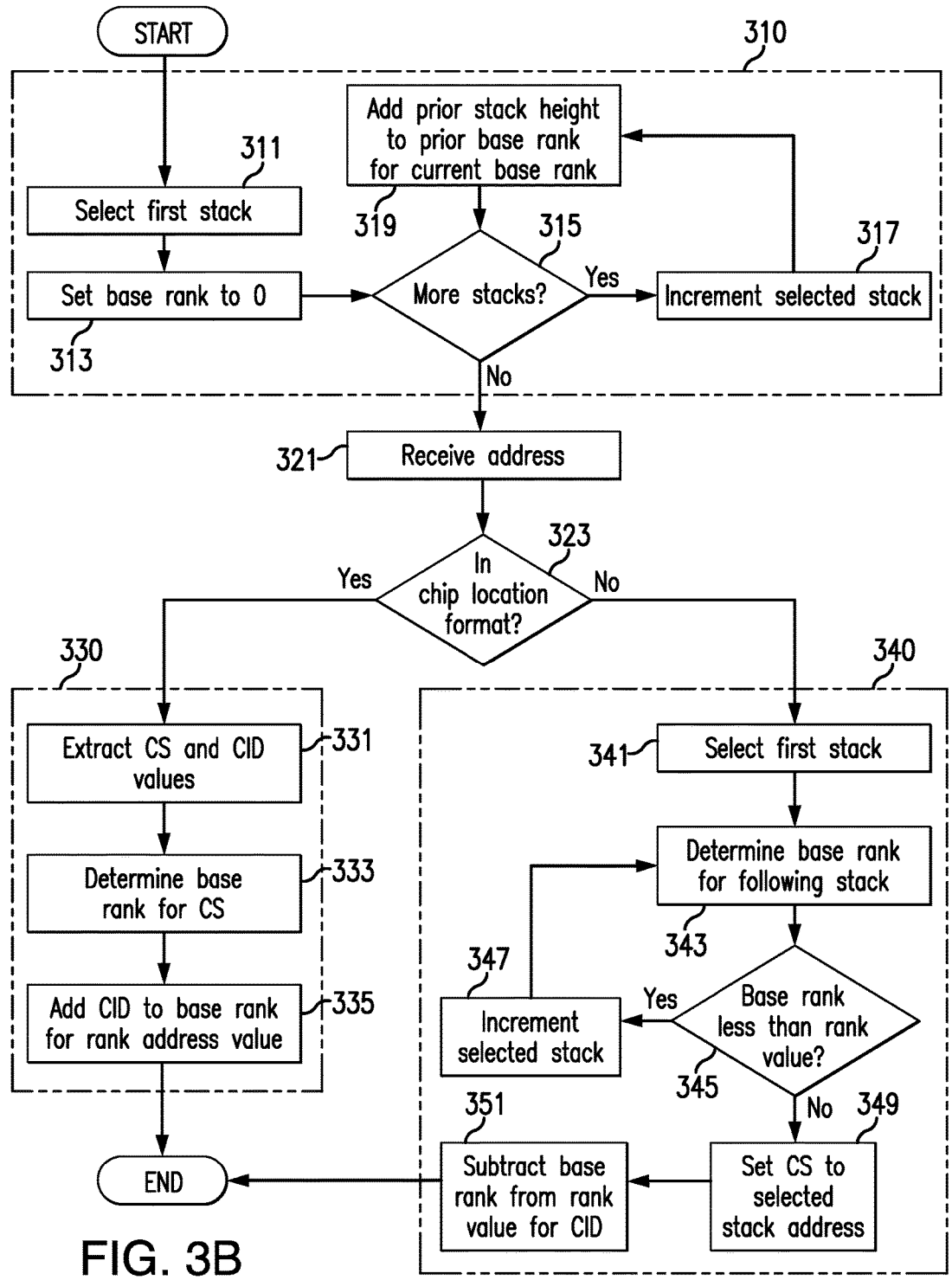
FIG. 3B is a flow diagram illustrating a process of assigning rank values to chip locations in a 3DS memory, in one embodiment of the present invention.

The first example optimization process is illustrated in the flowchart of FIG. 3B. This flowchart also illustrates a corresponding process for converting a rank back to a chip location.

In stage 310, a base rank lookup table is prepared. This stage only need be performed once for all addresses, and is preferably performed as part of, or immediately following, the definition of the non-uniform stack configuration.

Specifically, at 311, the first stack (at CS0) is selected. At 313, a base rank value for the first stack is set to 0, and is stored to a base rank lookup table in association with the CS address of the stack.

At 315, it is determined if there are more stacks in the memory, according to the determined stack configuration. If so, the selected stack is incremented at 317.

At 319, the base rank value for the newly selected stack is set to the base rank value of the previous stack, plus the height of the previous stack according to the determined stack configuration. As an example, for CS1, the previous stack is CS0. Using the example in FIG. 3, CS0 (stack 50a) has a height of eight chips, and (by definition) a base rank value of 0. Therefore, the base rank value of CS1 (stack 50b) is 8+0, or 8. Similarly, because the height of CS1 (stack 50b) is four chips and its base rank value is 8, the base rank value of CS2 is 4+8, or 12. These base rank values are also stored to the base rank lookup table in association with the CS address of their stacks.

The loop returns to 315 to again determine if there are more stacks in the memory. Once all stacks have been evaluated in this manner, the base rank lookup table will have a base rank value for each stack in the memory, and the table preparation stage 310 may end.

Address conversion may now begin. This conversion may be conducted at any time once the base rank lookup table is prepared, to convert any provided address to an optimized rank form, and may be repeated later without also repeating the base rank lookup table preparation stage 310.

First, at 321, an address is received, and at 323, it is determined if the address is in chip location form—that is, separate CS and CID addresses. If so, a rank address conversion stage 330 begins.

Specifically, at 331, the CS and CID address values are extracted. At 333, the base rank value associated with the CS address is determined from the base rank lookup table. At 335, this bank rank value is added to the CID address value, resulting in the rank address value. (It is noted that the base level chip—that is, the chip at CID0—for each stack will have the base rank value of the stack as its virtual rank.) The conversion then ends and the CS and CID addresses have been optimized into virtual rank form.

This process may also reverse the optimization to determine the CS/CID equivalent of a virtual rank value. If, at 323, it is determined that the provided address is not in chip location form—that is, it is instead in virtual rank form—a CS/CID conversion stage 340 begins. Like the rank address conversion stage 330, this stage may be conducted at any time once the base rank lookup table is prepared, and may be repeated later without also repeating the base rank lookup table preparation stage 310.

Specifically, at 341, the first stack (at CS0) is selected. At 343, the base rank value for the stack following the selected stack (e.g., for the first iteration, the base rank value of CS1) is determined from the base rank lookup table. (For the purposes of this process, if there is no following stack, the determined base rank value for this operation may be set to $R_{MAX}$, or any number larger than $R_{MAX}$.) If this value is determined, at 345, to be less than the provided virtual rank value, the virtual rank is not in the presently selected stack, and the selected stack is incremented at 347 before returning to 343. If, however, this value is equal to or greater than the provided virtual rank value, the virtual rank is in the presently selected stack, and the CS address value is therefore determined according to that stack at 349. The base rank value is then subtracted from the provided virtual rank value, thereby determining the CID address value. With both the CS and CID determined, the conversion ends and the physical chip location for the virtual rank is known.

It is noted that this process results in the ranks depicted in FIG. 3A, but additionally produces the base rank lookup table, which allows for the CS/CID conversion stage 340.

Figure 4A:
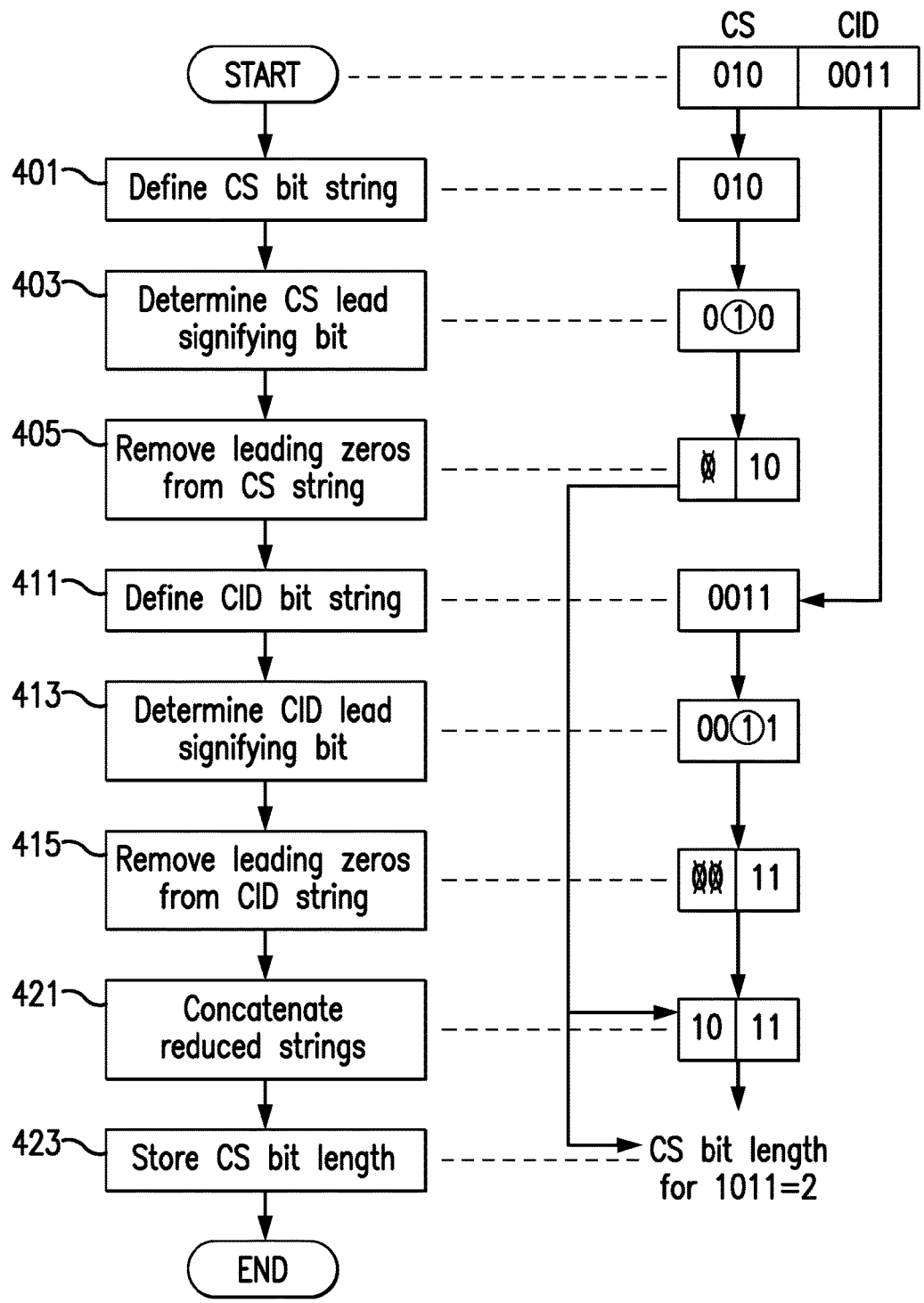
FIG. 4A is a flow diagram illustrating another process of assigning rank values to chip locations in a 3DS memory, with example results, in one embodiment of the present invention.

The second example optimization process is illustrated in the flowchart and corresponding state depictions of FIG. 4A.

At 401, the CS address of the chip location is defined by an ordered set of bits; that is, a bit string, or binary representation of the address value. The CS address may be available in as part of a complete address of the chip location, such as a CS/CID combination; if so, it may be extracted from this complete address. However, if the complete address is not previously optimized, the CS address so extracted may be expected to have a total number of bits reflective of $CS_{MAX}$; for instance, in binary representation, the number of bits will be $\log_2 (CS_{MAX})$, rounded up. (A binary encoding will be assumed hereinafter, but those of skill in the art will be able to adapt the described embodiments to other implementations. It also is noted that, in practice, $CS_{MAX}$ is preferably set to a power of two in value, in order to maximize space usage and simplify certain access rules according to a binary implementation. If this is assumed, the rounding up of the logarithmic result is unnecessary.) In the depicted example, the CS address is CS2, but is represented by three bits as 010, presumably because the unoptimized addressing accounts for a $CS_{MAX}$ of 8.

At 403, a lead signifying bit is determined; this bit is the non-null value (in binary, a 1) in a position more significant than any other non-null valued bit in the bit string. In the depicted example, this is the second bit.

All bits in the string more significant than the lead signifying bit are therefore null values (in binary, a 0), making them "leading zeros" in the string. In the depicted example, the first bit is a leading zero. At 405, these leading zeros are removed from the CS address to generate a reduced CS address, also in the form of an ordered set of bits. In the depicted example, this results in a reduced CS address bit string of 10.

At 411 through 415, operations 401 through 405 are repeated upon the CID address of the chip location, generating a reduced CID address in the form of an ordered set of bits. The unoptimized form of the CID address may be expected to have a total number of bits reflective at least of the "height" of the virtual uniform stack configuration ($CID_{MAX}$); in binary representation, the number of bits will be $\log_2 (CID_{MAX})$, rounded up. (As with $CS_{MAX}$, it is usually safe to assume in practice that $CID_{MAX}$ is set to a power of two in value and rounding up is unnecessary.) In the depicted example, a CID address of CID3 is initially represented in bit string form as 0011, with four bits due to a $CID_{MAX}$ of 16, but is reduced to a bit string of 11.

At 421, the reduced CS address and the reduced CID address are concatenated. The result is the rank value, which is 1011 in binary, or eleven in decimal.

Preferably, at 423, the length in bits of the reduced CS address bit string is stored to a bit-length lookup table in correspondence with the rank value. This information will be necessary to convert the rank value back to the CS/CID form of the chip location, as will be described later herein.

In another embodiment, the length of the reduced CID address bit string is stored at 423, instead of the length of the reduced CS address bit string.

It is noted that the process described above produces a shorter reduced CS address bit string, on average, if the stacks are ordered tallest to shortest, starting with CS0. In such an ordering, any high CID value having few or no leading zeros in its unoptimized form will always be paired with a low CS value having many or all leading zeros in its unoptimized form. This ordering may be accomplished by predetermined physical arrangement of the stacks according to this rule. It may also be accomplished by virtual assignment of the CS address values according to the stack sizes; that is, the coupling point for the tallest stack is given the CS address of CS0 regardless of their physical locations relative to the other stacks and coupling points, the coupling point for the second tallest is given CS1, and so on.

Figure 4B:
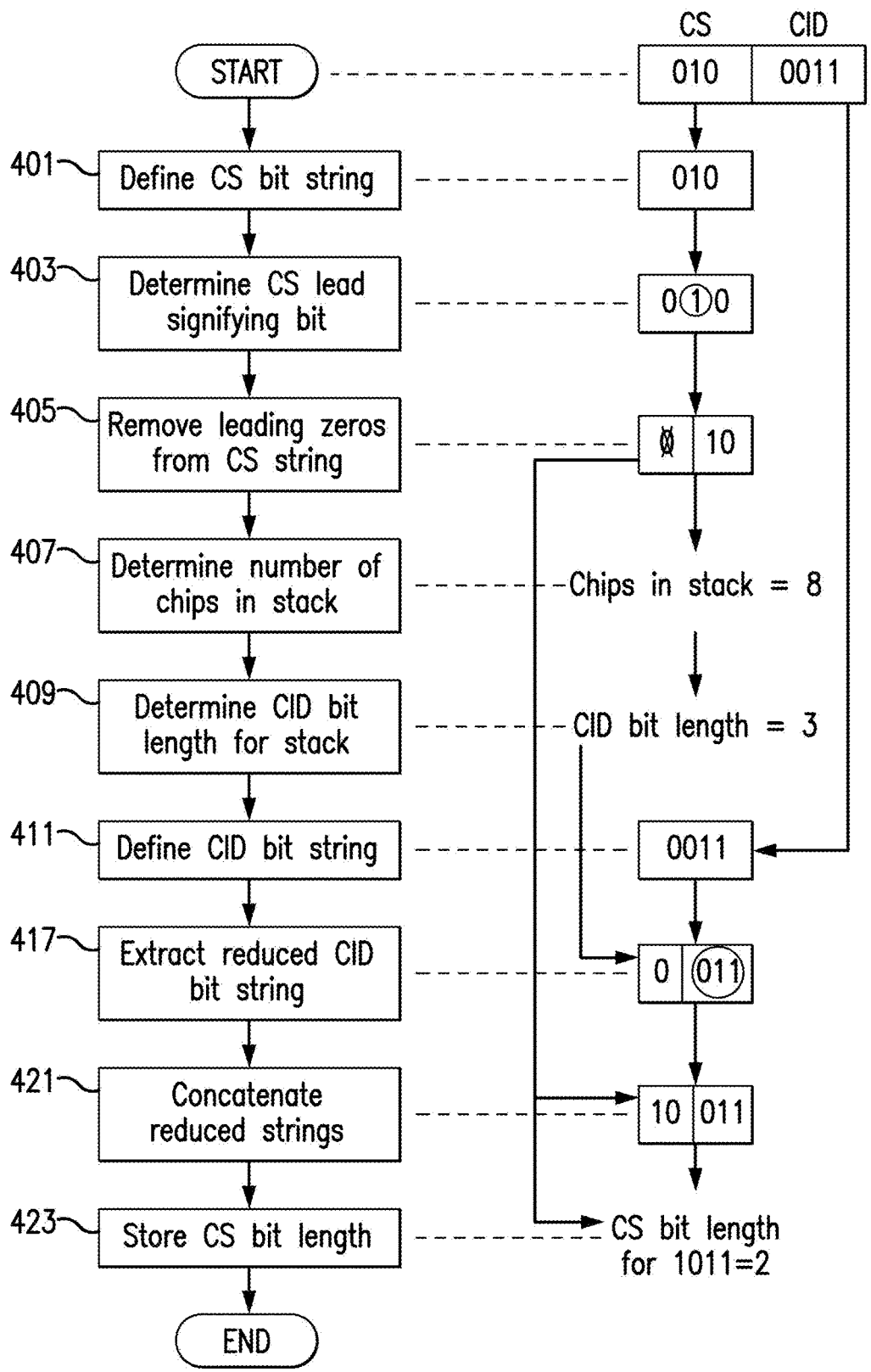
FIG. 4B is a flow diagram illustrating yet another process of assigning rank values to chip locations in a 3DS memory, with example results, in another embodiment of the present invention.

The third example optimization process is illustrated in the flowchart and corresponding state depictions of FIG. 4B.

Operations 401 through 405 are conducted upon the CS address as in the second process. However, an additional operation 407 determines the total number of chips ($CID_{CS}$) in the particular stack having the provided CS address, preferably according to the non-uniform stack configuration determined earlier. In the depicted example, the CS address is CS2. Let us assume, for the depicted example, that the stack at the address CS2 has a total of eight chips; $CID_{CS2}=8$. The minimum number of bits necessary to represent the "highest" chip in this stack is then determined at 409. In a binary implementation, this will be $\log_2 (CID_{CS})$; in the depicted example, $\log_2 (8)=3$. This number represents the maximum bit length of a bit string representing any chip level actually present in the stack at the CS address.

The CID bit string is defined or determined at 411 as in the process depicted in FIG. 4A. However, operations 413 and 415 do not occur. Instead, at 417, a number of bits equal to the number determined at 409 are extracted from the CID bit string, starting with the least significant bit. In the depicted example, the three least significant bits are extracted, resulting in a reduced CID address of 011.

Operations 421 and 423 then proceed as in FIG. 4A. The process then concludes.

It is noted that, for either the second or third process, a base level chip of a stack, or a planar chip, will in binary implementations have a CID address of zero. Therefore, the entire rank value for such chips is represented solely by the bits of the CS address.

Other suitable rank value assignment techniques, either involving or not involving mathematical conversions, known to those of skill in the art may also be employed.

Once the virtual rank mapping portion 220 assigns a rank value to each chip in the memory 5', the correspondence between the rank value and the location of the chip may in some embodiments be stored in a mapping table within the memory controller 1. The location of the chip is preferably defined according to its combination of CS and CID locations—that is, its location in the virtual, uniform chip configuration—and this will be assumed hereinafter, although other embodiments are also possible. These CS and CID locations, or address, may be stored as a combined unit in the mapping table, or individually in separate columns.

In certain embodiments, however, a complete mapping table may be unnecessary. This may be so, for instance, if the assignment of rank values to chip locations is made according to an invertible process, such as an invertible mathematical function converting the CS and CID values to a single rank value. In such embodiments, a mapping of any chip location to its corresponding optimized rank, or a mapping of any rank to its corresponding chip location, may be conducted individually at any time.

The example optimization processes illustrated in the rank address conversion stage 330 of FIG. 3B is not directly invertible, but may be inverted with knowledge of the base rank value of each stack according to the base rank lookup table. An example of this inversion is described in the CS/CID conversion stage 340 of the same figure. Therefore, the rank value lookup table is sufficient to substitute for a complete mapping table for this process.

Similarly, the example optimization processes illustrated in FIGS. 4A and 4B are not directly invertible, but may be inverted with knowledge of the bit length of either the CS portion or CID portion of a given rank value, which is determined and stored in a bit length lookup table in operation 423. Therefore, the bit length lookup table is sufficient to substitute for a complete mapping table with either process.

4. Rank-Based Optimized Addresses

A rank value, which may also be termed a virtual rank address, may be combined with a bank address which defines a bank within a chip. In some embodiments, this combination is generated by concatenating the bit string, or ordered set of bits, representing the rank value with the bit string representing the bank address. The combination may be termed the optimized address of a particular bank in a particular chip in the memory 5', in comparison to a combination of chip location (that is, CS address and CID address) and bank address which forms an unoptimized address of the same memory bank. The rank value may also be combined with other memory addressing featuring to form a more complete memory address of a specific memory location, also optimized over the equivalent memory address which contains the CS and CID addresses in combination.

Figure 5A:
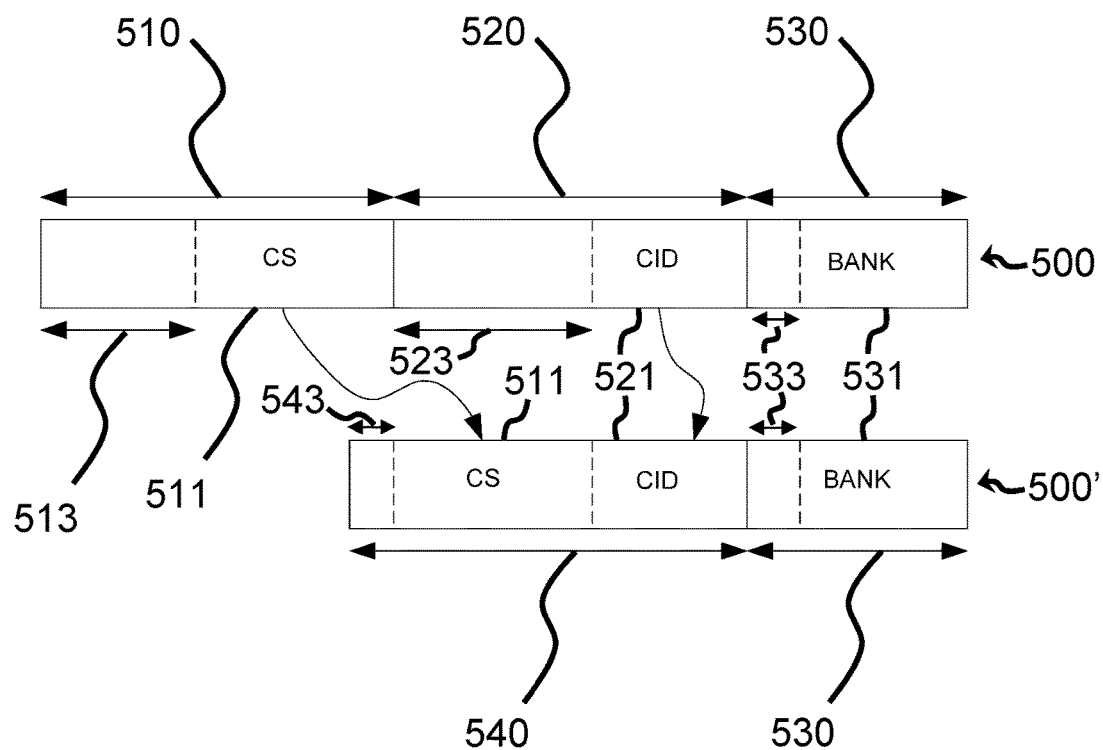
FIG. 5A is a diagram illustrating an unoptimized address and a corresponding optimized address, in accordance with an embodiment of the present invention.

FIG. 5A illustrates an example unoptimized address and corresponding optimized address, in accordance with an embodiment of the invention.

Using a standard binary encoding, preferably, a bank address 530 will always be $\log_2 (B_{MAX})$ in length. If the bank address value 531 itself is shorter in number of bits, leading zeroes are appended to fill the extra bank address bits 533. This does not change between an unoptimized address 500 and its corresponding optimized address 500'.

In the unoptimized address 500, the CS address 510 is $\log_2 (CS_{MAX})$ in length, rounded up to the nearest integer. If the CS address value 511 itself is shorter in number of bits, leading zeroes are appended to fill the extra CS address bits 513. Likewise, the CID address 520 is $\log_2 (CID_{MAX})$ in length, rounded up to the nearest integer, and leading zeroes are appended to the CID address value 521 to fill the extra CID address bits 523.

However, in the optimized address 500', the rank address 540 is, in most circumstances, shorter than the combination of the CS and CID addresses 510 and 520. Therefore, the optimized address 500' itself is also shorter than the unoptimized address 500. For the same reasons, the number of extra rank address bits 543 filled by appended leading zeroes is in most circumstances less than the combined number of extra CS address bits 513 and extra CID address bits 523, reducing wasted bits in the optimized address 500'.

Figure 5B:
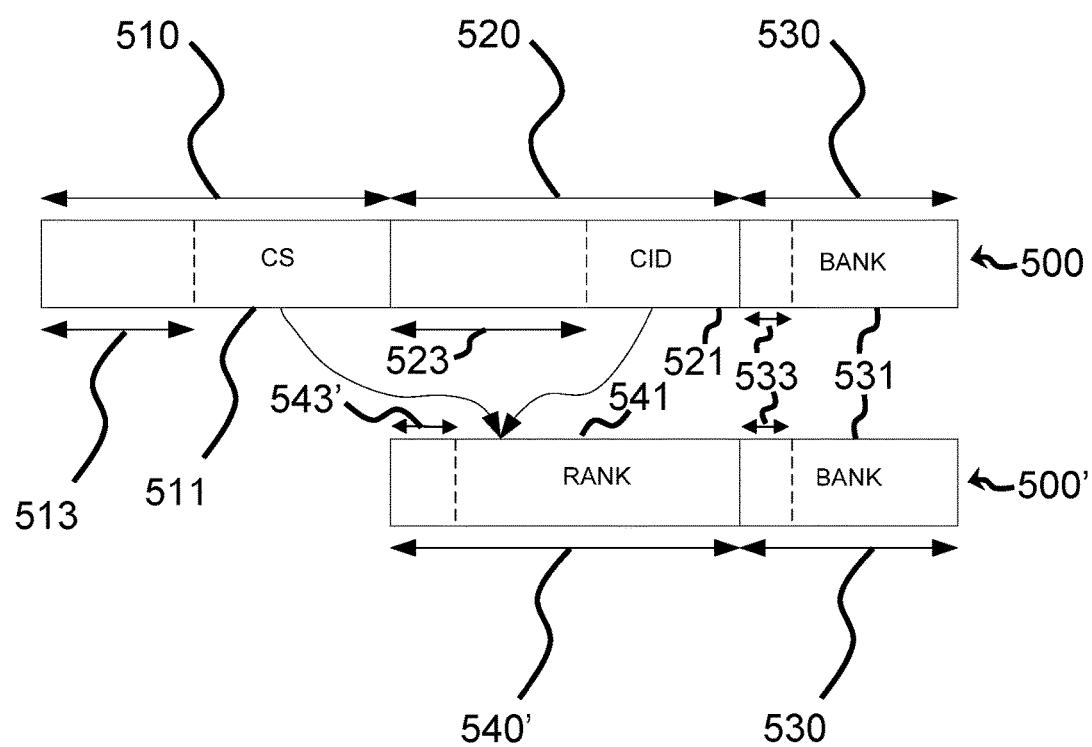
FIG. 5B is a diagram illustrating an unoptimized address and a corresponding optimized address, in accordance with another embodiment of the present invention.

The optimization depicted in FIG. 5A may result, for instance, from the processes depicted in FIG. 4A or 4B. However, further optimization is possible, as depicted in FIG. 5B. For example, using the optimization process depicted in FIG. 3B, a rank address 540' contains a single rank value 541 which does not require the CS and CID values to have separate representation at all. Because the rank values produced by the process of FIG. 3B cannot, by definition, exceed $R_{MAX}$, the length of rank address 540' is guaranteed to be $\log_2 (R_{MAX})$ or less, while maintaining complete accuracy of addressing. Also, the number of extra rank address bits 543' is, again, in most circumstances less than the combined number of extra CS address bits 513 and extra CID address bits 523

Returning to FIG. 2, the memory controller 1 includes an address conversion portion 230. In the illustrated embodiment, the address conversion portion 230 is integrated into the data control 20, but it may also be integrated into the command control 10 or other elements of the memory controller 1. Additionally, in some embodiments, the address conversion portion 230 may be combined with the virtual rank mapping portion 220, as in some embodiments their respective functions overlap. However, in other embodiments, such as the embodiment illustrated in FIG. 2, the address conversion portion 230 is merely coupled to the virtual rank mapping portion 220.

Upon receiving a rank value (that is, a virtual rank address), the address conversion portion 230 actuates to convert the rank value to the CS address and CID address of the chip assigned said rank value. Additionally, upon receiving a combination of CS address and CID address defining the location of a chip in the memory 5', the address conversion portion 230 actuates to convert the CS/CID combination to the corresponding rank value.

For convenience, the process of changing the CS/CID combination to the rank value will be termed a "rank conversion" hereinafter, and the process of changing the rank value to the CS/CID combination will be termed a "CS/CID conversion."

When provided with an unoptimized address including a bank address (such as unoptimized address 500), the address conversion portion 230 preferably performs a rank conversion on a CS address and CID address extracted from the unoptimized address, while preserving the value of the bank address, thereby generating an optimized address (such as optimized address 500'). Likewise, provided with an optimized address including a bank address, the address conversion portion 230 preferably performs a CS/CID conversion on a rank value extracted from the optimized address, while preserving the value of the bank address, thereby generating an unoptimized address.

Preferably, the CS/CID conversion is done immediately prior to accessing the chip at the resulting address in the memory 5', and the rank conversion is done immediately after receiving data from the chip at the chip location defined by the CS/CID combination. In this manner, the memory 5' may execute data access operations, such as reads and writes, according to the CS/CID combination and/or the unoptimized address, and therefore the memory 5' operates as in a conventional 3DS system. However, preferably, most or all functions of the memory controller 1, such as the monitoring, tracking, and control of these data access operations, may be executed according to the rank value and/or the optimized address. These functions as adapted to rank values and optimized addresses will be described further below.

In embodiments where the virtual rank mapping portion 220 stores the correspondence between rank values and CS/CID combination to a mapping table, the address conversion portion 230 may execute either conversion through a lookup operation in the mapping table. That is, for a rank conversion of a CS/CID combination, said combination is located in the mapping table, and its corresponding rank value is the output of the rank conversion; and for a CS/CID conversion of a rank value, said rank value is located in the mapping table, and its corresponding CS and CID addresses are the output of the CS/CID conversion.

In embodiments where the virtual rank mapping portion 220 assigns rank values according to an invertible mathematical function or other invertible process, the address conversion portion 230 may execute the rank conversion using the same function or method, and may execute the CS/CID conversion using the inverse of said function or method.

In embodiments where the virtual rank mapping portion 220 assigns rank values according to the example process depicted in FIG. 3B, the address conversion portion 230 may execute the rank conversion using the rank address conversion stage 330 from the same process, and may execute the CS/CID conversion using the CS/CID conversion stage 340.

In embodiments where the virtual rank mapping portion 220 assigns rank values according to the example processes depicted in FIG. 4A or 4B, the address conversion portion 230 may execute the rank conversion using the same method, although it need not perform the bit length storage operation 423 as the bit length lookup table should already be full. The address conversion portion 230 may execute the CS/CID conversion first by searching the bit-length lookup table for the CS address bit length associated with the provided rank value; it then extracts that number of bits from the most significant bits of the rank value, thus determining the CS address, and the unextracted bits in the rank value are determined to be the CID address. If the bit-length lookup table contains CID address bit lengths rather than CS address bit lengths, the address conversion portion 230 extracts that number of bits from the least significant bits of the rank value, thus determining the CID address, and the unextracted bits in the rank value are determined to be the CS address.

Other rank and CS/CID conversions are also conceivable by those of skill in the art, in accordance with the corresponding mapping process.

In some cases, it may be desirable to determine the CS address or the CID address associated with a rank value, without needing both. Those of skill in the art will appreciate that the above CS/CID conversions may be altered to provide only one address or the other. Furthermore, in some embodiments, individually determining the CS and CID addresses for a given rank value is more efficient, and a complete CS/CID conversion may be accomplished by combining the results of the two determinations.

In some embodiments, the method by which the address conversion portion 230 executes the rank conversion has substantial overlap in operations with the method by which the virtual rank mapping portion 220 assigns the ranks, as shown above. Therefore, in some embodiments, either the virtual rank mapping portion 220 or the address conversion portion 230 may execute some or all of these overlapping operations in both methods. In other embodiments, the virtual rank mapping portion 220 and the address conversion portion 230 are effectively integrated.

5. Memory Controller Optimizations

A memory controller 1 stores information about each bank and each chip in the coupled memory 5' for several purposes. The shorter, optimized addresses and rank values may be used as indices for this information, in place of the longer, unoptimized addresses and CS/CID combination chip locations. The functions of the memory controller may also be adapted to the shorter addresses. Functions that require less than the complete address may extract only the CS, CID, or bank address values from the address as needed.

Although the memory controller 1 requires additional logic to implement the memory profiling portion 210, virtual rank mapping portion 220, and address conversion portion 230, the cost of including said logic is easily recouped through the space savings in using the optimized addresses as indices, even before the reduction in logic due to the reduced $B_{SUPP}$ is taken into account. In short, the addressing overhead necessary to monitor and control the data access operations of the memory is optimized.

As noted earlier, a 3DS specification and its operations are preferably built on the DDR3 or DDR4 specifications. Such specifications are known in the art.

Generally, when transmitting a signal to the memory 5' which includes one or more relevant chip locations or memory addresses, the memory controller 1 may instead use the rank values or optimized addresses, reducing the overall size of the signal until it reaches the address conversion portion 230. At the address conversion portion 230, the rank value or optimized address is converted to the corresponding CS/CID chip location or unoptimized address, then the CS address is promptly extracted to select the appropriate data path, and the remainder of the address and signal is transmitted therethrough to the appropriate stack in the memory 5'. In this manner, the signal spends a reduced amount of transmission time with an unoptimized address, which in various embodiments may optimize overall transmission time, transmission power usage, and/or the necessary circuitry for said transmission.

Generally, when storing information about a chip or bank in the memory 5', for monitoring, maintenance, or other reasons, the memory controller 1 may index the information by the rank values or optimized addresses. The table or other data storage containing this information may be thereby reduced in size and, in many instances, in lookup operation time.

A non-exclusive list of memory controller signals and indexes that may use the optimized addressing, employed in various embodiments, includes:

The destination bank of a data entry;
Prior and subsequent banks containing additional portions of the data entry;
Whether a bank is "busy" (that is, processing a previous command or data request);
Whether a bank needs to be activated;
Whether a bank is activated and ready for data entry;
Whether a bank is ready for data entry (but not activated);
Whether a bank meets command to command timing;
Whether a bank needs to be precharged; and
Whether a bank needs to be refreshed.

Those of skill in the art will generally appreciate other ways to alter 3DS operations to adapt to the optimized addressing described above.

Additionally, the determined non-uniform stack configuration may be utilized in other optimizations. A few specific and non-exclusive optimizations, employed in certain embodiments, are now described as illustrative examples.

In certain embodiments, a memory controller sends maintenance signals of varying types at regular intervals, including but not limited to auto-refresh signals, device input/output driver calibration, and period training. For simplicity of processing, many conventional memory controllers send a maintenance signal to every chip location in the uniform stack configuration, or every bank thereof, and the memory merely ignores any maintenance signal to a chip or bank which is not actually present. Therefore, in certain embodiments, using the optimized $B_{SUPP}$ and $R_{MAX}$, the overall number of maintenance signals sent may be reduced with each maintenance cycle, without inadvertently failing to send a signal to a chip or bank that is actually present in the memory 5'. In some embodiments, the memory controller 1 may additionally examine the determined non-uniform stack configuration or the mapping table, and thereby determine which rank values correspond to chips actually present in the memory 5'; it may then send maintenance signals solely to those chips and their banks.

In certain embodiments, the command control portion 10 or other portion of the memory controller 1 may command the memory 5' to conduct refresh operations, on a schedule or according to other parameters. The commands may in some embodiments be sent through all data paths to all stacks, effectively simultaneously, for a given chip level. That is, all stacks receive a refresh command for CID0, then an appropriate amount of time elapses before all stacks receive a refresh command for CID1, and so on until the "top" level of the largest stack has been reached.

Conventionally, these refresh operations assume a uniform stack configuration, and therefore can instruct a stack to refresh a chip level that is not actually occupied in the stack. This can result in errors or, at minimum, wasted power for the unnecessary command signals. Therefore, in some embodiments of the described system, stacks that do not reach a given level do not receive the command to refresh that level. This can be accomplished through, for example, a bit array designating "enabled" and "disabled" CS addresses for each CID, reflective of whether the stack at a CS includes the CID level in question. This bit array, or other encoding representing the data, can be identical to or generated from the stored actual and uniform configurations generated by the memory profiling portion 210. The determined "height" of the uniform stack configuration itself is also relevant as it determines when all CID levels having a chip in at least one stack have received the refresh command.

Refresh commands may also be withheld from stacks or chips that do not require a refresh, according to existing evaluation operations which are known in the art. This information may, for instance, also be stored in a bit array, and the "do not refresh" determination for a chip location made according to an OR operation of the appropriate cells of each array.

As noted above, in a common configuration, a stack in the memory 5' receives any signals through a coupling point at a base CID level and routes it to the various chips in the stack. (For this reason, the base level and the other levels are sometimes termed "master" and "slave" levels, respectively.) The circuitry necessary for this routing introduces additional timing and other complexities to the transmission of the signals. Therefore, when accessing a non-planar stack, the memory controller 1 preferably considers certain additional parameters. These parameters are specific to the memory design and preferably provided by the memory 5'. In particular, certain timing requirements, such as expected response delay for a signal, may be exclusive to a particular stack or even a particular CID level within the stack, in addition to the usual timing delays and other requirements for the memory itself.

However, conventional 3DS-enabled memory controller systems assume all CS addresses represent stacks, not planar chips. Due to the absence of routing circuitry, the sole chip in a planar "stack" has no additional timing delay, while even the chip at the base CID of a true stack has an additional timing delay which must be accounted for. Although the memory 5' can in some embodiments provide the memory controller 1 with the correct timing parameter (that is, zero) for the planar chip, the CID-level countdown function is still executed unnecessarily. Therefore, in some embodiments of the described system, the memory controller 1 recognizes the presence of planar chips at a given CS according to the determined non-uniform stack configuration, and does not execute the CID-level countdown for these planar chips, but only for non-planar stacks. Those of skill in the art will recognize that, similarly, other considerations required only for true stacks may be ignored for planar chips in a similar fashion.

6. Exemplary Implementation of the System and Method

Figure 6:
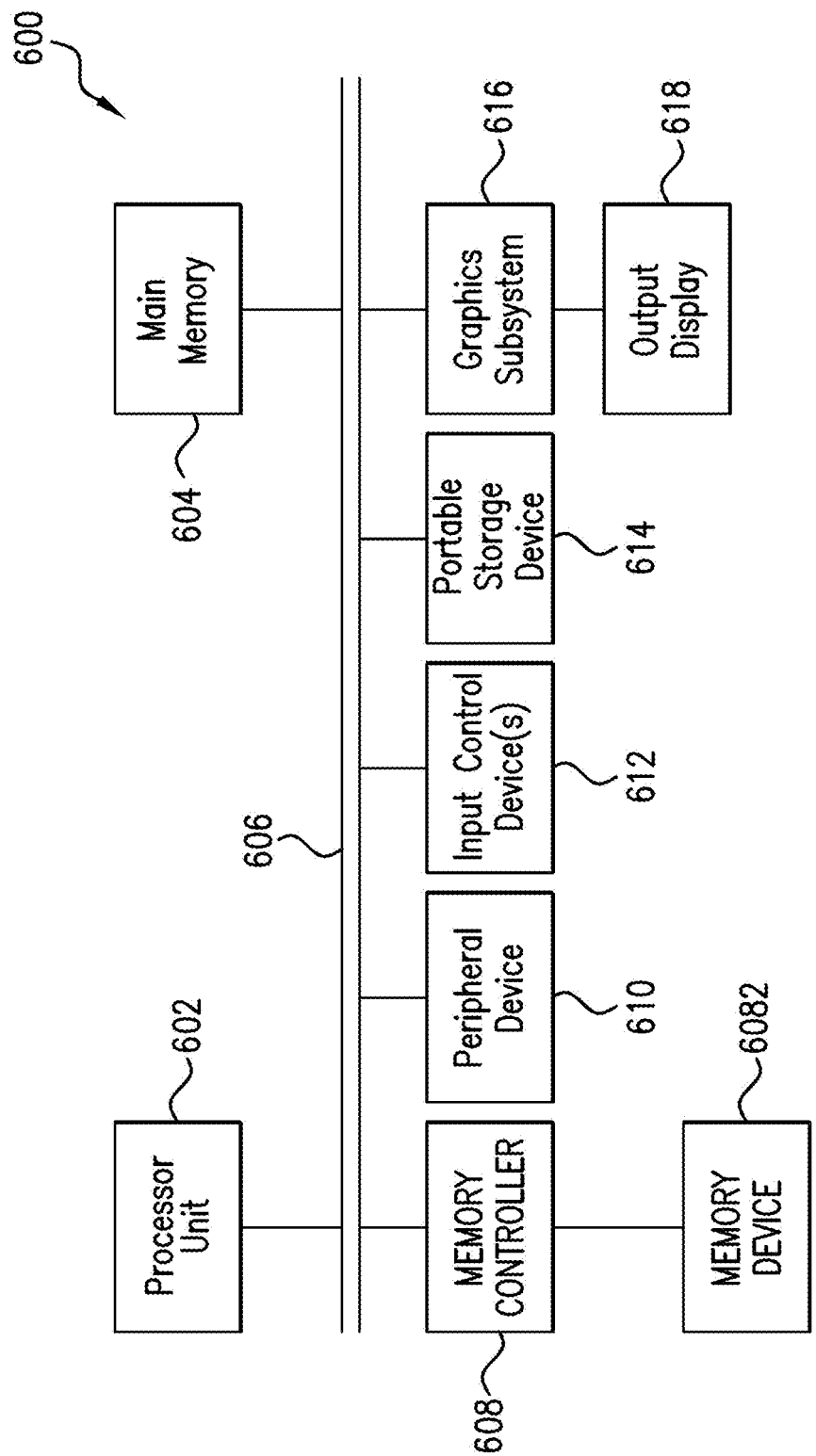
FIG. 6 is a block diagram illustrating an example computer system for programmatic and/or hardware implementation of various embodiments and aspects of the present invention.

The memory controller system as a whole may be implemented in a computer system. As an example, FIG. 6 is a block diagram illustrating an exemplary computer system for installation of the memory controller system, in accordance with various configurations of the disclosed system and method.

A computer system 600 contains: a processor unit 602, a main memory 604, an interconnect bus 606, a memory controller 608 that is coupled to a memory device 6082, peripheral device(s) 610, input control device(s) 612, portable storage medium drive(s) 614, a graphics subsystem 616, and an output display 618. Processor unit 602 may include a single microprocessor or a plurality of microprocessors for configuring computer system 600 as a multiprocessor system. Main memory 604 stores, in part, instructions and data to be executed by processor unit 602. Main memory 604 preferably includes banks of dynamic random access memory (DRAM) as well as high-speed cache memory.

For the purpose of simplicity, the components of computer system 600 are interconnected via interconnect bus 606. However, computer system 600 may be interconnected through one or more data transport means. For example, processor unit 602 and main memory 604 may be interconnected via a local microprocessor bus; and memory controller 608, peripheral device(s) 610, portable storage medium drive(s) 614, and graphics subsystem 616 may be interconnected via one or more input/output (I/O) buses. Memory device 6082 may be implemented as a nonvolatile semiconductor memory for storing data and instructions to be used by processor unit 602. Memory device 6082 may store the software to load it to the main memory 604 or may be represented in an EDA tool simulation by suitable classes (incorporating data structures and functions operable upon the data structures) or the like as would be known to one of skill in the art.

Portable storage medium drive 614 operates to input and output data and code to and from the computer system 600. In one configuration, the software is stored on such a portable medium, and is input to computer system 600 via portable storage medium drive 614. Peripheral device(s) 610 may include any type of computer support device such as an input/output (I/O) interface, to add additional functionality to computer system 600. For example, peripheral device(s) 610 may include a network interface card, to interface computer system 600 to a network. Peripheral device(s) may also include a memory controller and nonvolatile memory.

Input control device(s) 612 provide a portion of the user interface for a computer system 600 user. Input control device(s) 612 may include an alphanumeric keypad for inputting alphanumeric and other key information; and a cursor control device such as a mouse, a trackpad or stylus; or cursor direction keys.

In order to display textual and graphical information, computer system 600 contains graphics subsystem 614 and output display(s) 618. Output display 618 may include a cathode ray tube (CRT) display, liquid crystal display (LCD), plasma, or active matrix organic light emitting diode (AMOLED) display. Graphics subsystem 616 receives textual and graphical information, and processes the information for output to display 618.

The descriptions above are intended to illustrate possible implementations of the disclosed system and method, and are not restrictive. While this disclosure has been made in connection with specific forms and embodiments thereof, it will be appreciated that various modifications other than those discussed above may be resorted to without departing from the spirit or scope of the disclosed system and method. Such variations, modifications, and alternatives will become apparent to the skilled artisan upon a review of the disclosure. For example, functionally equivalent elements or method steps may be substituted for those specifically shown and described, and certain features may be used independently of other features, and all or some of the above embodiments may be selectively combined with each other, and in certain cases, particular locations of elements or sequence of method steps may be reversed or interposed, all without departing from the spirit or scope of the disclosed system and method as defined in the appended claims. The scope should therefore be determined with reference to the description above and the appended claims, along with their full range of equivalents.

What is claimed is:

1. A memory controller system for controlling access to a memory device having a plurality of integrated circuit (IC) chips disposed in a non-uniform stack configuration within a three-dimensional stacked (3DS) structure, the memory controller system comprising:
    a memory profiling portion configured to determine the non-uniform stack configuration of the memory device, the non-uniform stack configuration being defined by a plurality of selectable stacks each having at least one selectable chip, with at least one of the stacks being formed by less chips than another of the stacks formed by a maximum number of chips, the non-uniform stack configuration occupying a subset of chip locations within a uniform stack configuration virtually defined by at least all stacks of the plurality of selectable stacks being formed by the maximum number of chips;
    a virtual rank mapping portion configured to assign a subset of virtual ranks allocated for the uniform stack configuration virtually defined for the memory device to the subset of chip locations actually defined by the non-uniform stack configuration; and
    an address conversion portion coupled to said virtual rank mapping portion, said address conversion portion configured to convert an unoptimized address definable with reference to the uniform stack configuration by an unoptimized set of bits to an optimized address defined with reference to the non-uniform stack configuration by an optimized set of bits shorter in bit length than said unoptimized set of bits,
    wherein addressing overhead during monitoring of data access operations to the memory device is optimized.

2. The memory controller system of claim 1, wherein:
    each stack has an associated stack address definable by an ordered set of stack bits, a bit having a non-null value in a position more significant than any other non-null valued bit in the ordered set of stack bits being a lead signifying stack bit, all stack bits having a null value in a position more significant than the lead signifying stack bit being leading zeros of the stack address;
    each chip level in a stack has an associated chip address definable by an ordered set of chip bits, a bit having a non-null value in a position more significant than any other non-null valued bit in the ordered set of chip bits being a lead signifying chip bit, all chip bits having a null value in a position more significant than the lead signifying chip bit being leading zeros of the chip address; and
    each unoptimized address is defined at least in part by an unoptimized set of address bits including the ordered set of stack bits and the ordered set of chip bits associated with the stack and chip level of an addressed chip.

3. The memory controller system of claim 2, wherein the address conversion portion executes to:
    extract the ordered sets of stack and chip bits from the unoptimized set of bits of the unoptimized address;
    remove all leading zeros from the ordered sets of stack and chip bits to generate reduced ordered sets of stack and chip bits, respectively; and
    concatenate the reduced ordered sets of stack and chip bits.

4. The memory controller system of claim 2, wherein:
    the address conversion portion is further configured to convert an optimized address to a corresponding unoptimized address;

the memory device executes data access operations according to the unoptimized address; and the memory controller system monitors at least one data access operation according to the optimized address.

5. The memory controller system of claim 4, wherein:

an optimized address is defined at least in part by an optimized set of address bits including a reduced ordered set of stack bits;

the virtual rank mapping portion is further configured to generate a bit-length lookup table listing a number of bits in the reduced ordered set of stack bits for each actual chip in association with said actual chip; and the address conversion portion executes to:
perform a lookup operation in the bit-length lookup table to determine the number of bits in the reduced ordered set of stack bits, and
extract the number of bits in the reduced ordered set of stack bits from the most significant bits of the optimized address to determine the reduced ordered set of stack bits.

6. The memory controller system of claim 2, wherein:

each stack has a chip address maximum bit length reflective of the largest chip level in the stack; and the address conversion portion executes to:
extract the ordered sets of stack and chip bits from the unoptimized set of bits of the unoptimized address,
determine the chip address maximum bit length of the ordered set of chip bits according to a stack represented by the ordered set of stack bits,
remove, from the ordered set of stack bits, all leading zeros to generate a reduced ordered set of stack bits,
extract, from the ordered set of chip bits, a number of least significant bits from the ordered set of chip bits equal to the chip address maximum bit length to generate a reduced ordered set of chip bits, and
concatenate the reduced ordered sets of stack and chip bits.

7. The memory controller system of claim 2, wherein:

the virtual rank mapping portion is further configured to generate an address mapping table listing a chip address and stack address of each actual chip location in association with the virtual rank assigned to the actual chip location; and the address conversion portion executes to:
extract the ordered sets of stack and chip bits from the unoptimized set of bits of the unoptimized address;
perform a lookup operation in the address mapping table according to the chip and stack addresses defined by the extracted ordered sets of stack and chip bits, respectively.

8. The memory controller system of claim 1, wherein the virtual rank mapping portion executes to assign a virtual rank to each actual chip location according to the optimized address generated by the address conversion of an unoptimized address of the actual chip location.

9. The memory controller system of claim 1, wherein:

each stack has an associated stack address definable by a numerical stack value;

each chip level in a stack has an associated chip address definable by a numerical chip value;

each unoptimized address is defined at least in part by an unoptimized set of address bits representing the stack and chip values respectively associated with the stack and chip level of an addressed chip;

each stack includes a base chip level;

the virtual rank mapping portion is further configured to generate a base rank lookup table listing a numerical value of a virtual rank of a chip at the base chip level of each stack in association with said stack; and the address conversion portion executes to:
perform a lookup operation in the base rank lookup table to determine an base level rank associated with a stack, and
add a chip level value of an addressed chip to a base level rank value of a stack of an addressed chip to determine a virtual rank value.

10. A memory controller system for controlling access to a memory device having a plurality of integrated circuit (IC) chips disposed in a non-uniform stack configuration within a three-dimensional stacked (3DS) structure, the memory controller system comprising:

a memory profiling portion configured to determine the non-uniform stack configuration of the memory device, the non-uniform stack configuration being defined by a plurality of selectable stacks each having at least one selectable chip, with at least one of the stacks being formed by less chips than another of the stacks formed by a maximum number of chips, the non-uniform stack configuration occupying a subset of chip locations within a uniform stack configuration virtually defined by at least all stacks of the plurality of selectable stacks being formed by the maximum number of chips;

a virtual rank mapping portion configured to assign a subset of virtual ranks allocated for the uniform stack configuration virtually defined for the memory device to the subset of chip locations actually defined by the non-uniform stack configuration; and an address conversion portion coupled to said virtual rank mapping portion, said address conversion portion configured to convert an unoptimized address definable with reference to the uniform stack configuration by an unoptimized set of bits to an optimized address defined with reference to the non-uniform stack configuration by an optimized set of bits shorter in bit length than said unoptimized set of bits, wherein the virtual rank mapping portion executes to assign a virtual rank to each actual chip location according to the optimized address generated by the address conversion of an unoptimized address of the actual chip location, and wherein addressing overhead during monitoring of data access operations to the memory device is optimized.

11. The memory controller system of claim 10, wherein:

each stack has an associated stack address definable by an ordered set of stack bits, a bit having a non-null value in a position more significant than any other non-null valued bit in the ordered set of stack bits being a lead signifying stack bit, all stack bits having a null value in a position more significant than the lead signifying stack bit being leading zeros of the stack address;

each chip level in a stack has an associated chip address definable by an ordered set of chip bits, a bit having a non-null value in a position more significant than any other non-null valued bit in the ordered set of chip bits being a lead signifying chip bit, all chip bits having a null value in a position more significant than the lead signifying chip bit being leading zeros of the chip address;

each unoptimized address is defined at least in part by an unoptimized set of address bits including the ordered set of stack bits and the ordered set of chip bits associated with the stack and chip level of an addressed chip; and the address conversion portion executes to:
  extract the ordered sets of stack and chip bits from the unoptimized set of bits of the unoptimized address;
  remove all leading zeros from the ordered sets of stack and chip bits to generate reduced ordered sets of stack and chip bits, respectively; and
  concatenate the reduced ordered sets of stack and chip bits.

12. The memory controller system of claim 11, wherein:
the virtual rank mapping portion is further configured to generate an address mapping table listing a chip address and stack address of each actual chip location in association with the virtual rank assigned to the actual chip location; and
the address conversion portion executes to:
  extract the ordered sets of stack and chip bits from the unoptimized set of bits of the unoptimized address;
  perform a lookup operation in the address mapping table according to the chip and stack addresses defined by the extracted ordered sets of stack and chip bits, respectively.

13. The memory controller system of claim 10, wherein:
the address conversion portion is further configured to convert an optimized address to a corresponding unoptimized address;
the memory device executes data access operations according to the unoptimized address; and
the memory controller system monitors at least one data access operation according to the optimized address.

14. The memory controller system of claim 10, wherein:
each stack has an associated stack address definable by a numerical stack value;
each chip level in a stack has an associated chip address definable by a numerical chip value;
each unoptimized address is defined at least in part by an unoptimized set of address bits representing the stack and chip values respectively associated with the stack and chip level of an addressed chip;
each stack includes a base chip level;
the virtual rank mapping portion is further configured to generate a base rank lookup table listing a numerical value of a virtual rank of a chip at the base chip level of each stack in association with said stack; and
the address conversion portion executes to:
  perform a lookup operation in the base rank lookup table to determine an base level rank associated with a stack, and
  add a chip level value of an addressed chip to a base level rank value of a stack of an addressed chip to determine a virtual rank value.

15. A method of optimally controlling access to a memory device having a plurality of integrated circuit (IC) chips disposed in a non-uniform stack configuration within a three-dimensional stacked (3DS) structure, the method comprising:
  executing a memory profiling portion of a memory controller system to determine the non-uniform stack configuration of the memory device, the non-uniform stack configuration being defined by a plurality of selectable stacks each having at least one selectable chip, with at least one of the stacks being formed by less chips than another of the stacks formed by a maximum number of chips, the non-uniform stack configuration occupying a subset of chip locations within a uniform stack configuration virtually defined by at least all stacks of the plurality of selectable stacks being formed by the maximum number of chips;
  executing a virtual rank mapping portion of the memory controller system to assign a subset of virtual ranks allocated for the uniform stack configuration virtually defined for the memory device to the subset of chip locations actually defined by the non-uniform stack configuration; and
  executing an address conversion portion of the memory controller system to convert an unoptimized address definable with reference to the uniform stack configuration by an unoptimized set of bits to an optimized address defined with reference to the non-uniform stack configuration by an optimized set of bits shorter in bit length than said unoptimized set of bits,
wherein addressing overhead during monitoring of data access operations to the memory device by the memory controller system is optimized.

16. The method of claim 15, wherein:
each stack has an associated stack address definable by an ordered set of stack bits, a bit having a non-null value in a position more significant than any other non-null valued bit in the ordered set of stack bits being a lead signifying stack bit, all stack bits having a null value in a position more significant than the lead signifying stack bit being leading zeros of the stack address;
each chip level in a stack has an associated chip address definable by an ordered set of chip bits, a bit having a non-null value in a position more significant than any other non-null valued bit in the ordered set of chip bits being a lead signifying chip bit, all chip bits having a null value in a position more significant than the lead signifying chip bit being leading zeros of the chip address; and
each unoptimized address is defined at least in part by an unoptimized set of address bits including the ordered set of stack bits and the ordered set of chip bits associated with the stack and chip level of an addressed chip.

17. The method of claim 15, wherein the conversion to the optimized address includes:
  extracting the ordered sets of stack and chip bits from the unoptimized set of bits of the unoptimized address;
  removing all leading zeros from the ordered sets of stack and chip bits to generate reduced ordered sets of stack and chip bits, respectively; and
  concatenating the reduced ordered sets of stack and chip bits.

18. The method of claim 15, further comprising converting an optimized address to a corresponding unoptimized address, wherein:
  the memory device executes data access operations according to the unoptimized address; and
  the memory controller system monitors at least one data access operation according to the optimized address.

19. The method of claim 18, wherein:
an optimized address is defined at least in part by an optimized set of address bits including a reduced ordered set of stack bits;
the virtual rank assignment includes generating a bit-length lookup table listing a number of bits in the reduced ordered set of stack bits for each actual chip in association with said actual chip; and
the conversion to the unoptimized address includes:
  performing a lookup operation in the bit-length lookup table to determine the number of bits in the reduced ordered set of stack bits, and extracting the number of bits in the reduced ordered set of stack bits from the most significant bits of the optimized address to determine the reduced ordered set of stack bits.

20. The method of claim 15, wherein:

each stack has an associated stack address definable by a numerical stack value;

each chip level in a stack has an associated chip address definable by a numerical chip value;

each unoptimized address is defined at least in part by an unoptimized set of address bits representing the stack and chip values respectively associated with the stack and chip level of an addressed chip;

each stack includes a base chip level;

the virtual rank assignment includes generating a base rank lookup table listing a numerical value of a virtual rank of a chip at the base chip level of each stack in association with said stack; and the conversion to the optimized address includes:

performing a lookup operation in the base rank lookup table to determine an base level rank associated with a stack, and adding a chip level value of an addressed chip to a base level rank value of a stack of an addressed chip to determine a virtual rank value.

* * * * *